(12) United States Patent
Okuda

(10) Patent No.: US 7,642,844 B2
(45) Date of Patent: Jan. 5, 2010

(54) SEMICONDUCTOR INTEGRATED CIRCUIT FOR VOLTAGE DETECTION

(75) Inventor: Masaki Okuda, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 165 days.

(21) Appl. No.: 11/878,748

(22) Filed: Jul. 26, 2007

(65) Prior Publication Data

US 2008/0246540 A1    Oct. 9, 2008

(30) Foreign Application Priority Data

Sep. 29, 2006    (JP) .............................. 2006-269630

(51) Int. Cl.
    *H01L 25/00*    (2006.01)
(52) U.S. Cl. .................. 327/565; 257/299; 327/535; 327/536
(58) Field of Classification Search ............... 257/678; 327/534, 535, 536, 537, 545, 546, 565
    See application file for complete search history.

(56) References Cited

U.S. PATENT DOCUMENTS 5,111,068 A * 5/1992 Kusakabe .................. 327/565

6,531,912 B2 * 3/2003 Katou ........................ 327/536
7,193,292 B2 * 3/2007 Liaw ......................... 257/529

FOREIGN PATENT DOCUMENTS

| JP | 05-063147 A | | 3/1993 |
| JP | 0563147 A | * | 3/1993 |
| JP | 11111943 A | * | 4/1999 |
| JP | 2001-237374 A | | 8/2001 |

* cited by examiner

*Primary Examiner*—N Drew Richards
*Assistant Examiner*—Morgan Varner
(74) *Attorney, Agent, or Firm*—Arent Fox LLP

(57) ABSTRACT

A semiconductor integrated circuit includes a semiconductor substrate, one or more wells formed in the semiconductor substrate, one or more diffusion layers formed in the one or more wells, a plurality of interconnects formed in an interconnect layer, the one or more diffusion layers and the plurality of interconnects being connected in series to provide a coupling between a first potential and a second potential, and a comparison circuit coupled to one of the interconnects set at a third potential between the first potential and the second potential, and configured to compare the third potential with a reference potential, wherein a first interconnect of the plurality of interconnects that is set to the first potential is connected to at least a first well of the one or more wells and connected to a first diffusion layer of the one or more diffusion layers that is formed in the first well.

8 Claims, 22 Drawing Sheets

PRIOR ART

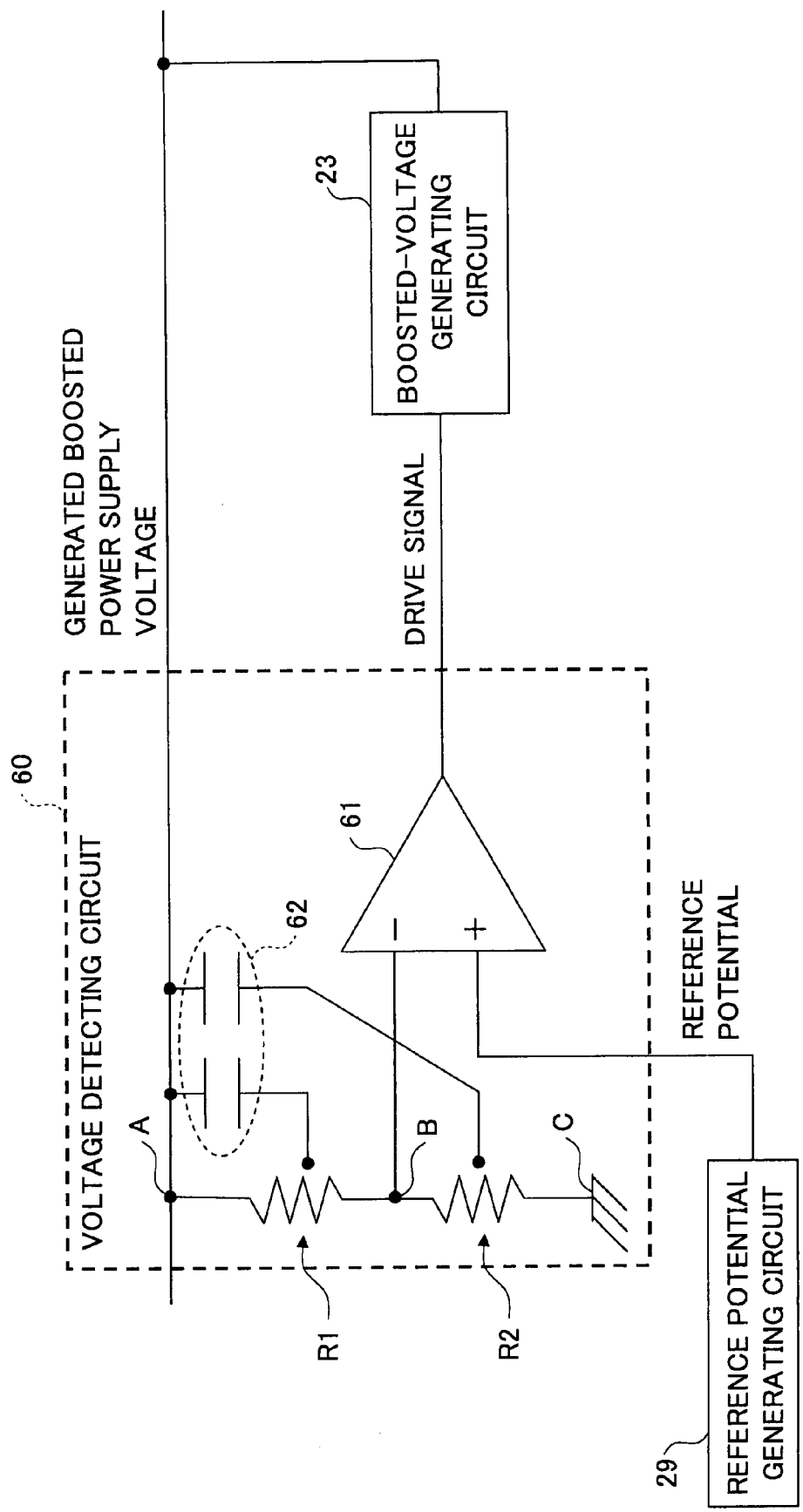

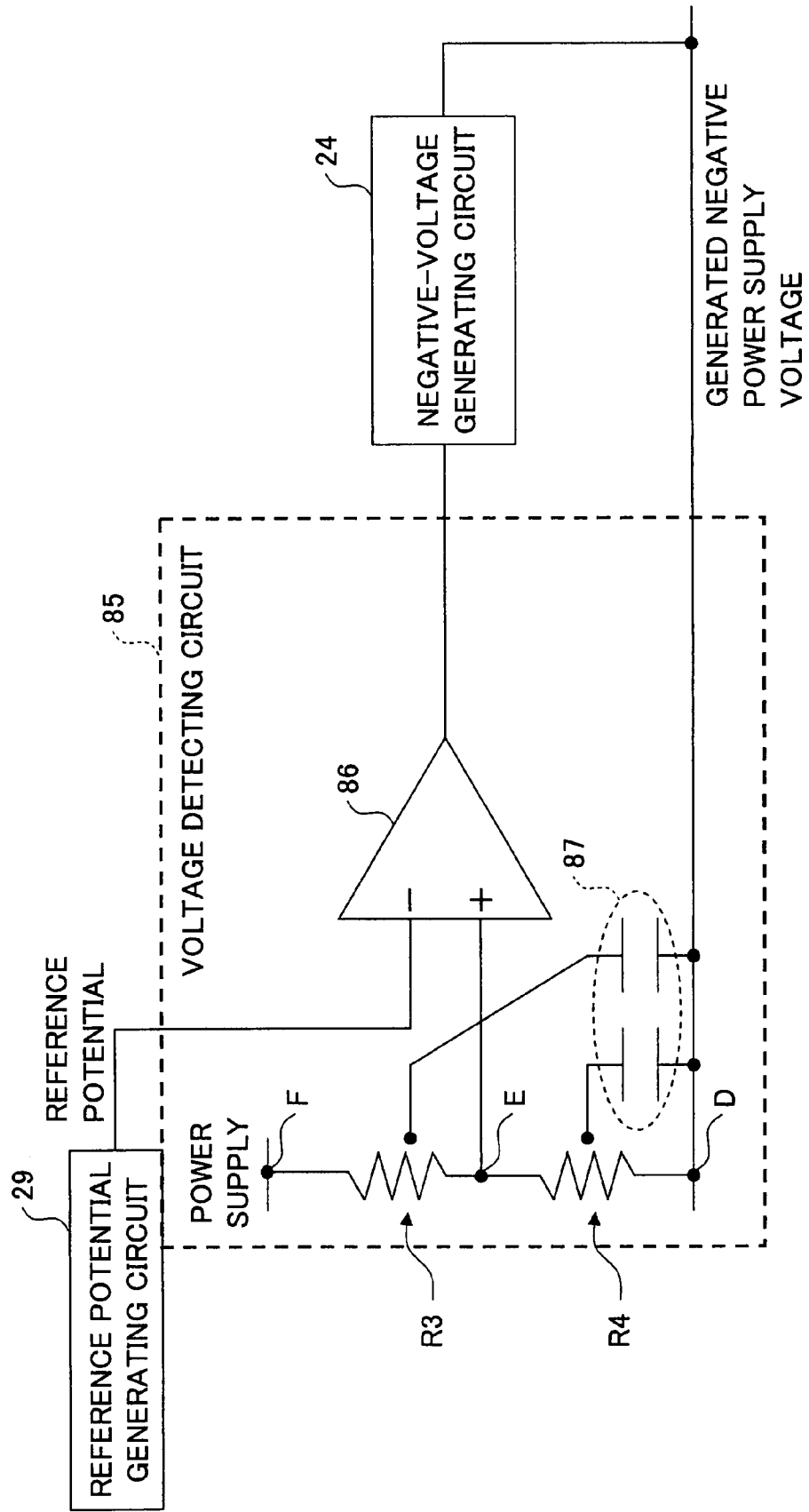

SEMICONDUCTOR INTEGRATED CIRCUIT FOR VOLTAGE DETECTION

CROSS-REFERENCE TO RELATED APPLICATIONS

The present application is based upon and claims the benefit of priority from the prior Japanese Patent Application No. 2006-269630 filed on Sep. 29, 2006, with the Japanese Patent Office, the entire contents of which are incorporated herein by reference.

BACKGROUND OF THE INVENTION

1. Field of the Invention

It is related to semiconductor integrated circuits, and particularly relates to a voltage detecting circuit for detecting the level of a potential that needs to be monitored.

2. Description of the Related Art

Semiconductor integrated circuits such as DRAM may employ a boosted-voltage generating circuit for internally generating a boosted power supply potential and/or a negative-voltage generating circuit for generating a negative potential based on a power supply voltage having predetermined potentials supplied from an external source. In the case of DRAM, for example, a boosted-voltage generating circuit for supplying a boosted potential as a word-line activating potential higher than the HIGH level is used to reliably store the HIGH level in memory cells at high speed. Further, a negative voltage generated by a negative-voltage generating circuit is used in the memory cell array.

FIG. 1 is a drawing showing an example of the configuration of a DRAM including a boosted-voltage generating circuit and negative-voltage generating circuit. A DRAM 10 shown in FIG. 1 includes an internal power supply generating unit 11, a memory cell array 12, and a memory access control circuit 13. The memory access control circuit 13 performs a read and write operation with respect to the memory cell array 12 in response to control signals and address signals supplied from an external source. The internal power supply generating unit 11 includes a voltage detecting circuit 21 and a voltage generating circuit 22. The voltage generating circuit 22 includes a boosted-voltage generating circuit 23 and a negative-voltage generating circuit 24. A boosted potential and negative potential generated by the boosted-voltage generating circuit 23 and negative-voltage generating circuit 24 are supplied to the memory cell array 12. The memory cell array 12 includes a transistor 25, a capacitor 26, a word-line driver 27, a word line WL, and a bit line BL. A plurality of word lines and a plurality of bit lines are arranged in rows and columns. A transistor 25 and capacitor 26 connected to each intersecting point constitutes a memory cell for storing one bit.

The voltage detecting circuit 21 detects a boosted potential and negative potential supplied to the memory cell array 12. Specifically, the voltage detecting circuit 21 compares a potential generated by dividing the boosted potential with a reference potential, and drives the boosted-voltage generating circuit 23 to step up the output of the boosted-voltage generating circuit 23 upon detecting that the divided potential drops below the reference potential. Further, the voltage detecting circuit 21 compares a potential generated by dividing the negative potential with a reference potential, and drives the negative-voltage generating circuit 24 to lower the output of the negative-voltage generating circuit 24 upon detecting that the divided potential rises above the reference potential.

FIG. 2 is a drawing showing an example of the circuit configuration of the voltage detecting circuit 21. The circuit configuration shown in FIG. 2 corresponds to the portion of the voltage detecting circuit 21 that relates to the detection of a boosted potential.

The voltage detecting circuit 21 of FIG. 2 includes resistor elements R1 and R2, a high-frequency-compensation capacitive element C1, and a differential amplifier 31. The differential amplifier 31 operates as a comparator circuit for comparing two inputs, and has an output thereof supplied as a drive signal (activation signal) to the boosted-voltage generating circuit 23 so as to control the active/inactive state of the boosted-voltage generating circuit 23. The inverted input node of the differential amplifier 31 receives a potential obtained by the resistor elements R1 and R2 dividing a boosted potential output from the boosted-voltage generating circuit 23, and the non-inverted input of the differential amplifier 31 receives a reference potential generated by a reference potential generating circuit 29.

As the output potential of the boosted-voltage generating circuit 23 drops due to current consumption in the memory cell array 12, the above-noted divided potential becomes lower than the reference potential. In response to the divided potential lower than the reference potential, the differential amplifier 31 asserts the drive signal, which is its output signal. In response to the assertion of the drive signal, the boosted-voltage generating circuit 23 becomes active, thereby raising its output potential. As the divided potential becomes higher than the reference potential due to the rise of the output potential, the operation of the boosted-voltage generating circuit 23 comes to a halt.

In order to suppress needless current consumption, resistor elements having extremely large resistances are used as the resistor elements R1 and R2. The amount of an electric current that actually flows is around 1 microampere. The divided potential appearing at the joint point between the resistor elements R1 and R2 thus does not respond with sufficient speed to a change in the boosted potential. There is thus a problem in that the response characteristics at high frequencies are not satisfactory. The high-frequency-compensation capacitive element C1 is provided for the purpose of compensating for the response characteristics at high frequencies. The high-frequency-compensation capacitive element C1 provides a low-impedance coupling between the boosted potential and the divided potential at high frequencies, thereby achieving a configuration in which a high-frequency fluctuation in the boosted potential directly propagates to the divided potential. This attains satisfactory response characteristics at high frequencies.

FIG. 3 is a drawing showing an example of the circuit configuration of the voltage detecting circuit 21. The circuit configuration shown in FIG. 3 corresponds to the portion of the voltage detecting circuit 21 that relates to the detection of a negative potential.

The voltage detecting circuit 21 of FIG. 3 includes resistor elements R3 and R4, a high-frequency-compensation capacitive element C2, and a differential amplifier 32. The output of the differential amplifier 32 is supplied as a drive signal (activation signal) to the negative-voltage generating circuit 24 so as to control the active/inactive state of the negative-voltage generating circuit 24. The non-inverted input node of the differential amplifier 32 receives a potential obtained by the resistor elements R3 and R4 dividing a negative potential output from the negative-voltage generating circuit 24, and the inverted input of the differential amplifier 32 receives a reference potential generated by the reference potential generating circuit 29.

The operation of the voltage detecting circuit 21 shown in FIG. 3 is basically the same as that of the voltage detecting circuit 21 shown in FIG. 2. Like the high-frequency-compensation capacitive element C1 shown in FIG. 2, the high-frequency-compensation capacitive element C2 is provided for the purpose of compensating for response characteristics at high frequencies. The high-frequency-compensation capacitive element C2 provides a low-impedance coupling between the negative potential and the divided potential at high frequencies, thereby achieving a configuration in which a high-frequency fluctuation in the negative potential directly propagates to the divided potential. This attains satisfactory response characteristics at high frequencies.

In the configurations shown in FIG. 2 and FIG. 3, the resistor elements R1 through R4 may be implemented by use of a metal material or polysilicon material disposed in a metal layer or polysilicon layer. In recent years, however, the metal layer and polysilicon layer serving as signal interconnect layers have become low resistance for the purpose of increasing signal speed. Because of this, it is difficult to manufacture resistor elements having high resistance. If the resistor elements R1 through R4 are made by using N-type or P-type diffusion layers having high resistance, elements of relatively small size having desired resistance may be obtained.

The capacitive elements C1 and C2 may be implemented by placing an oxide film between a diffusion layer and a polysilicon layer or metal layer situated above the diffusion layer. Alternatively, a capacitor may be implemented by using an N-channel or P-channel MOS transistor.

FIGS. 4A and 4B are drawings showing an example of a capacitive element implemented by using a P-channel MOS transistor. FIG. 4A is a plan view of the capacitive element, and FIG. 4B is a cross-sectional view of the capacitive element.

The configuration shown in FIGS. 4A and 4B includes metal interconnects 41 disposed in a metal layer for connection to a generated power supply, a polysilicon gate 42, a gate contact 43, source-drain contacts 44, a P-type diffusion layer 45, an N-type substrate 46, and a metal interconnect 47 disposed in the metal layer for connection to a divided potential node. The metal interconnects 41 are coupled to the P-type diffusion layer 45 via the source-drain contacts 44, and the metal interconnect 47 is coupled to the polysilicon gate 42 via the gate contact 43. An oxide film is placed between the P-type diffusion layer 45 and the polysilicon gate 42, thereby forming a capacitor between the P-type diffusion layer 45 and the polysilicon gate 42.

A voltage detecting circuit having a similar configuration to that of the voltage detecting circuit 21 shown in FIG. 2 is used in various circuits. FIG. 5 is a drawing showing an example of the configuration of a DC-DC converter using a voltage detecting circuit.

A DC-DC converter 50 shown in FIG. 5 includes a voltage detecting circuit 51, switching-element-control circuits 52 and 53, transistors 54 and 55, an inductor 56, and a capacitor 57. The voltage detecting circuit 51 detects an output voltage VOut of the DC-DC converter 50. Specifically, the voltage detecting circuit 51 compares a potential generated by dividing the output potential with a reference potential, and makes the transistor 54 conductive to raise the output potential upon detecting that the divided potential drops below the reference potential. Further, the voltage detecting circuit 51 makes the transistor 55 conductive to lower the output potential upon detecting that the divided potential rises above the reference potential. The voltage detecting circuit 51 operating as described above may be implemented by using substantially the same circuit configuration as that of the voltage detecting circuit 21 shown in FIG. 21.

In a voltage detecting circuit used in a semiconductor integrated circuit as described above, a capacitive element may be implemented by placing an oxide film between a diffusion layer and a polysilicon layer or metal layer, or may be implemented by use of an N-channel or P-channel MOS transistor. Either configuration, however, has a problem in that the circuitry size of a capacitive element is so large as to hinder the effort of reducing circuit size.

Accordingly, there is a need for a voltage detecting circuit that does not use a capacitive element in a semiconductor integrated circuit.

[Patent Document 1] Japanese Patent Application Publication No. 5-63147

[Patent Document 2] Japanese Patent Application Publication No. 2001-237374

SUMMARY OF THE INVENTION

It is a general object to provide a semiconductor integrated circuit that substantially obviates one or more problems caused by the limitations and disadvantages of the related art.

Features and advantages will be presented in the description which follows, and in part will become apparent from the description and the accompanying drawings, or may be learned by practice of the invention according to the teachings provided in the description. Objects as well as other features and advantages of the present invention will be realized and attained by a semiconductor integrated circuit particularly pointed out in the specification in such full, clear, concise, and exact terms as to enable a person having ordinary skill in the art to practice the invention.

To achieve these and other advantages in accordance with the purpose, the invention provides a semiconductor integrated circuit which includes a semiconductor substrate, one or more wells formed in the semiconductor substrate, one or more diffusion layers formed in the one or more wells, a plurality of interconnects formed in an interconnect layer, the one or more diffusion layers and the plurality of interconnects being connected in series to provide a coupling between a first potential and a second potential, and a comparison circuit coupled to one of the interconnects set at a third potential between the first potential and the second potential, and configured to compare the third potential with a reference potential, wherein a first interconnect of the plurality of interconnects that is set to the first potential is connected to at least a first well of the one or more wells and connected to a first diffusion layer of the one or more diffusion layers that is formed in the first well.

According to at least one embodiment, one or more diffusion layers constitute the resistor elements of a potential divider circuit, and one or more wells formed around the diffusion layers are coupled to a potential (i.e., the above-noted first potential) that is to be detected. This configuration makes it possible for parasitic capacitances between the one or more diffusion layers and the one or more wells to serve as a high-frequency-compensation parasitic capacitance, thereby providing a voltage detecting circuit that has a high-frequency-compensation capacitance without using a capacitive element.

BRIEF DESCRIPTION OF THE DRAWINGS

Other objects and further features of the present invention will be apparent from the following detailed description when read in conjunction with the accompanying drawings, in which:

FIG. 6 is a drawing showing an example of the configuration of a first embodiment of a voltage detecting circuit according to the present invention;

FIG. 8 is a drawing showing an example of the configuration of a second embodiment of a voltage detecting circuit according to the present invention;

DESCRIPTION OF THE PREFERRED EMBODIMENTS

Figure 1:
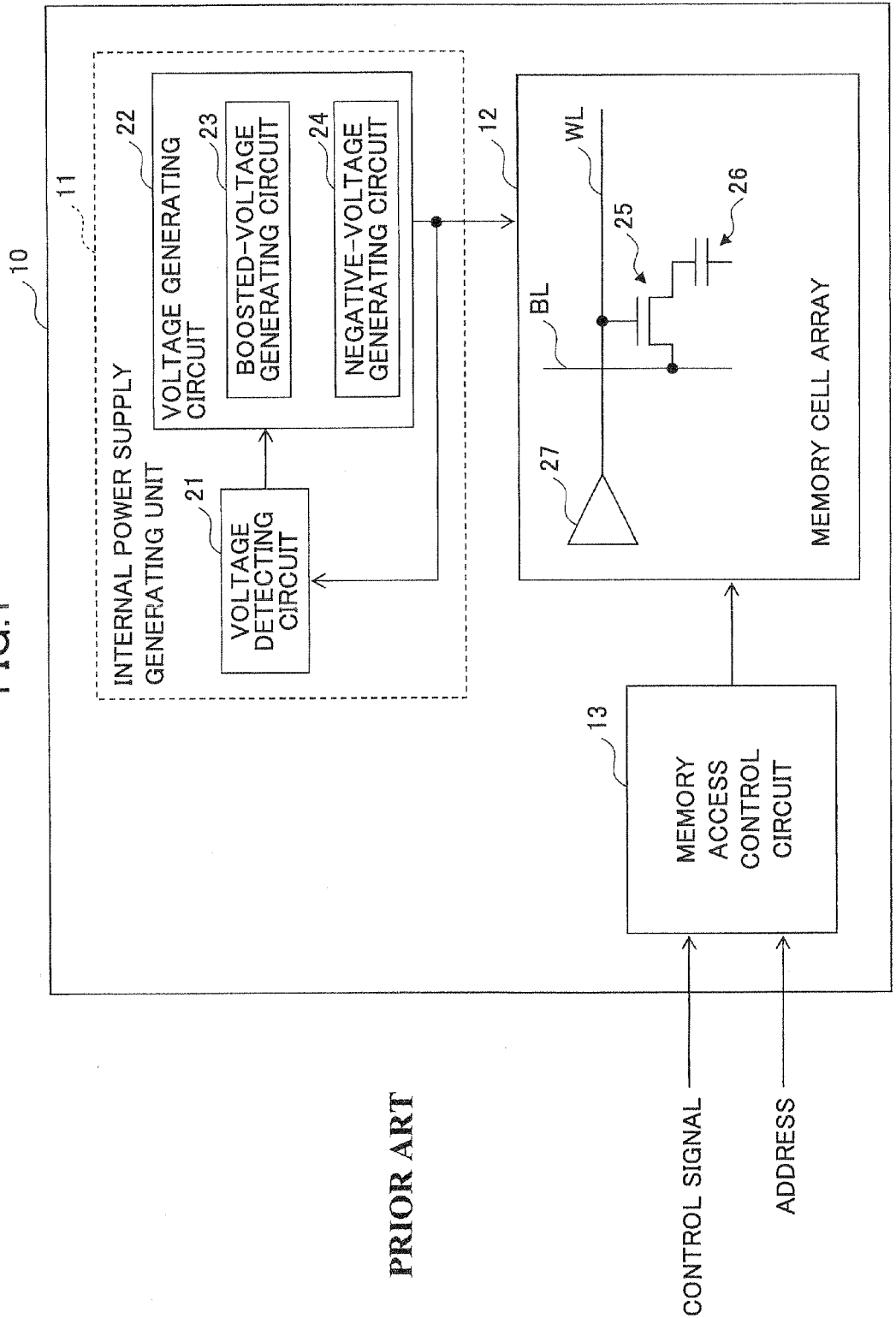
FIG. 1 is a drawing showing an example of the configuration of a DRAM including a boosted-voltage generating circuit and negative-voltage generating circuit.
Figure 2:
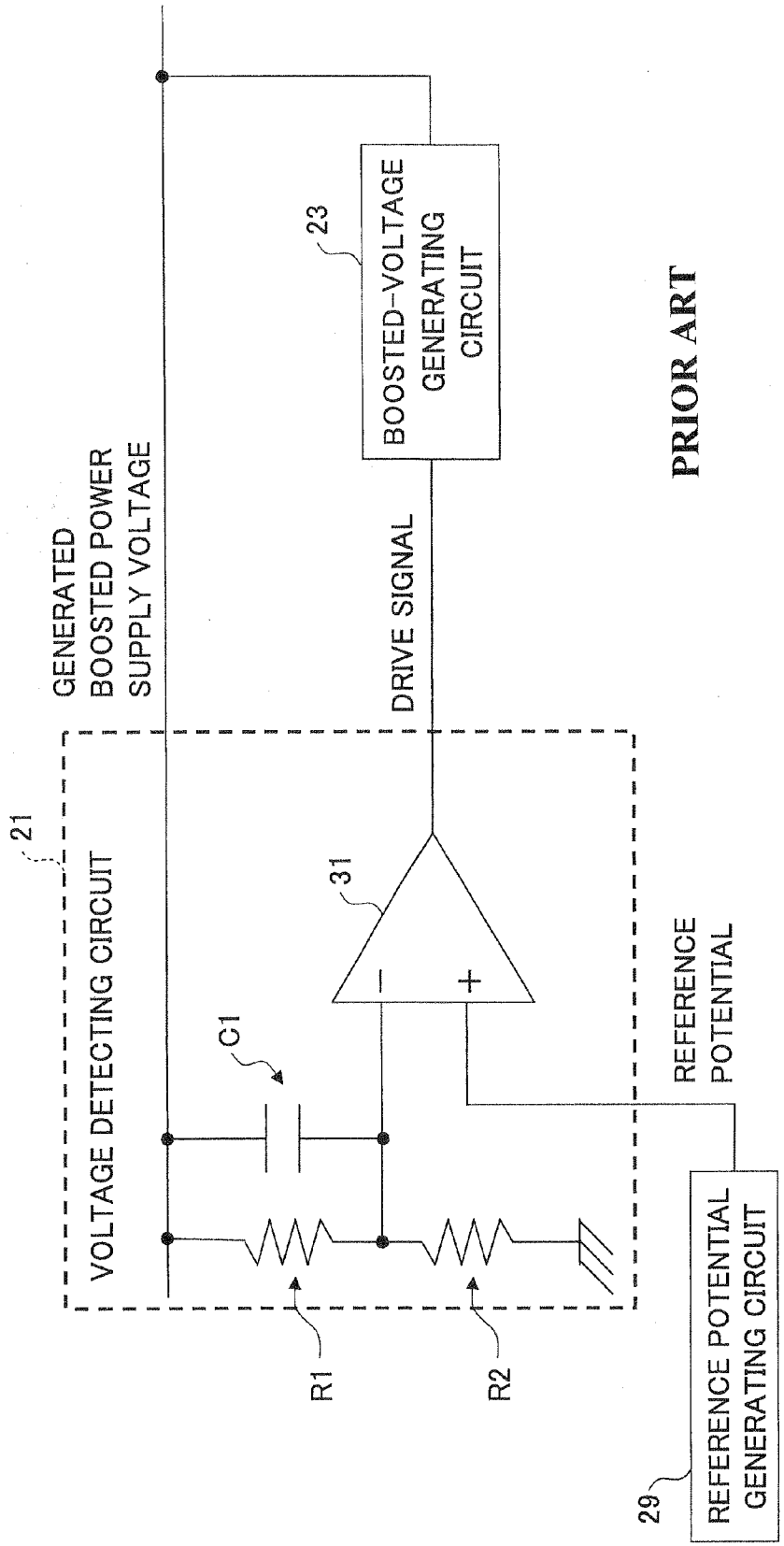
FIG. 2 is a drawing showing an example of the circuit configuration of the voltage detecting circuit.
Figure 3:
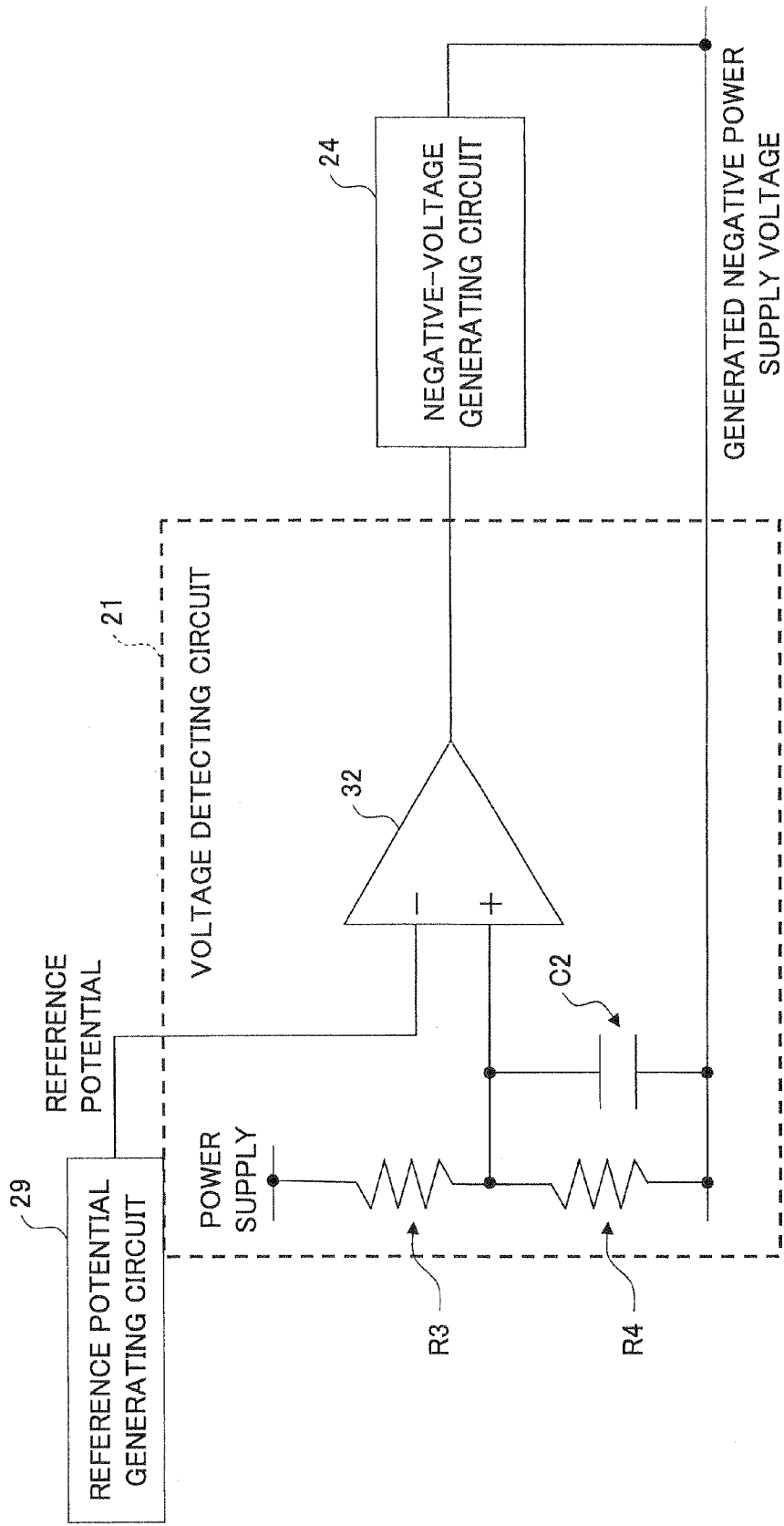
FIG. 3 is a drawing showing an example of the circuit configuration of the voltage detecting circuit.
Figure 4A:
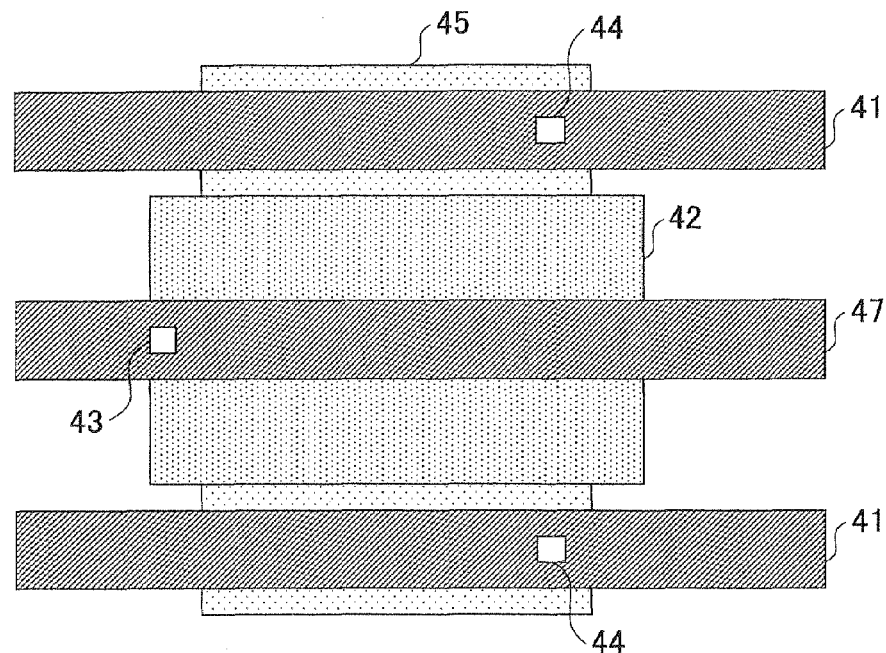
FIGS. 4A and 4B are drawings showing an example of a capacitive element implemented by using a P-channel MOS transistor.
Figure 4B:
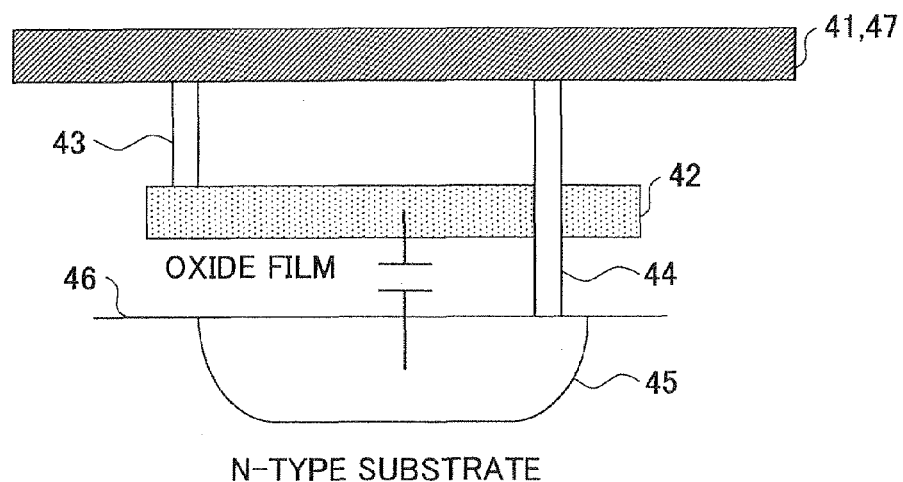
Figure 5:
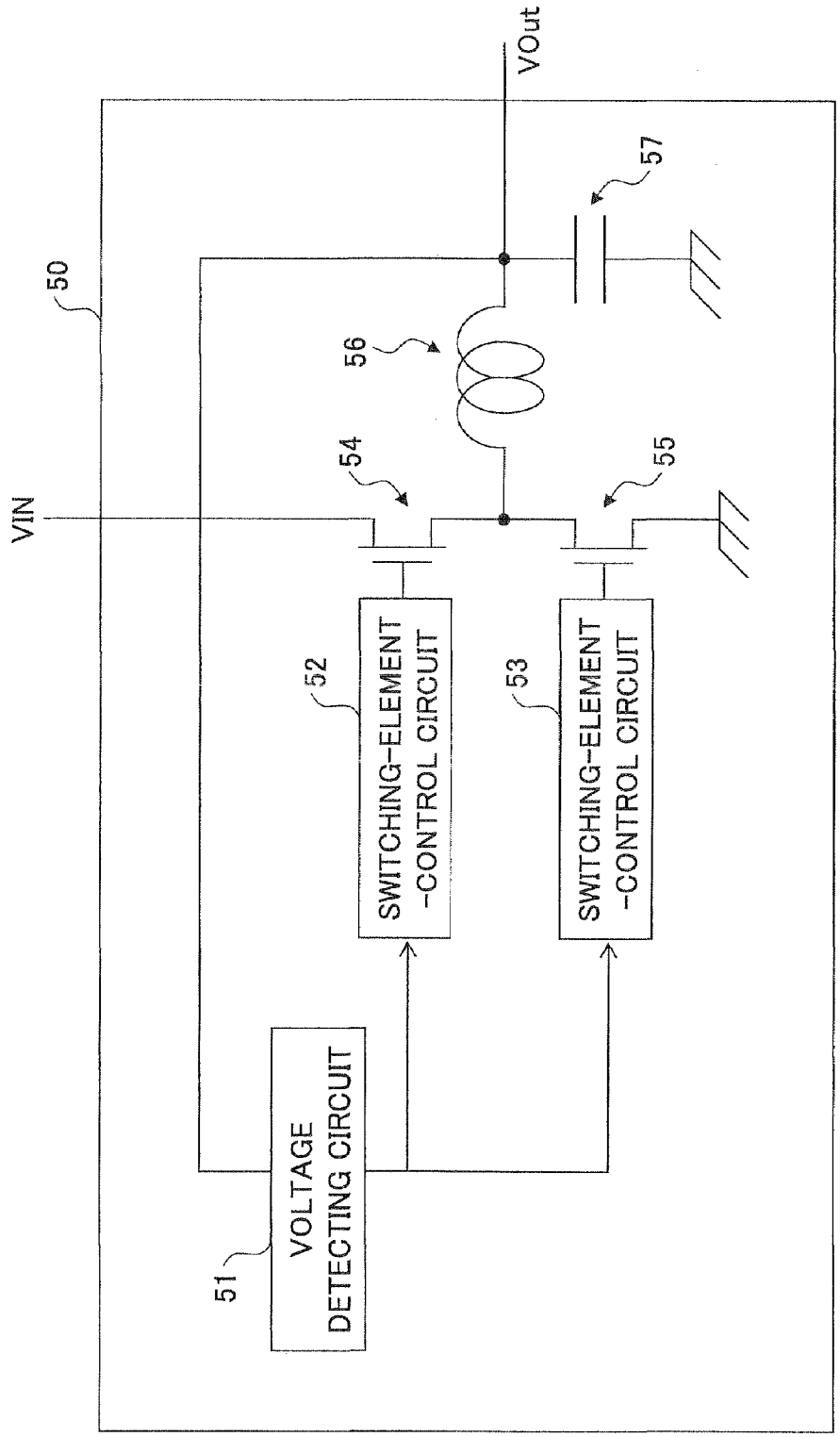
FIG. 5 is a drawing showing an example of the configuration of a DC-DC converter using a voltage detecting circuit.

In the following, embodiments of the present invention will be described in detail with reference to the accompanying drawings.

FIG. 6 is a drawing showing an example of the configuration of a first embodiment of a voltage detecting circuit according to the present invention. For the sake of explanation, a configuration relevant to the detection of a boosted potential by the voltage detecting circuit is illustrated.

The voltage detecting circuit 60 of FIG. 6 includes resistor elements R1 and R2, a differential amplifier 61, and a high-frequency-compensation parasitic capacitance 62. The differential amplifier 61 operates as a comparator circuit for comparing two inputs, and has an output thereof supplied as a drive signal (activation signal) to the boosted-voltage generating circuit 23 so as to control the active/inactive state of the boosted-voltage generating circuit 23. The inverted input node of the differential amplifier 61 receives a potential obtained by the resistor elements R1 and R2 dividing a boosted potential output from the boosted-voltage generating circuit 23, and the non-inverted input of the differential amplifier 61 receives a reference potential generated by a reference potential generating circuit 29.

As the output potential of the boosted-voltage generating circuit 23 drops due to current consumption in a load circuit, the above-noted divided potential becomes lower than the reference potential. In response to the divided potential lower than the reference potential, the differential amplifier 61 asserts the drive signal, which is its output signal. In response to the assertion of the drive signal, the boosted-voltage generating circuit 23 becomes active, thereby raising its output potential. As the divided potential becomes higher than the reference potential due to the rise of the output potential, the operation of the boosted-voltage generating circuit 23 comes to a halt.

In order to suppress needless current consumption, resistor elements having extremely large resistances are used as the resistor elements R1 and R2. The amount of an electric current that actually flows is around 1 microampere. The divided potential appearing at the joint point between the resistor elements R1 and R2 thus does not respond with sufficient speed to a change in the boosted potential. The high-frequency-compensation parasitic capacitance 62 is parasitic to the resistor elements R1 and R2 formed of a diffusion layer as will later be described, and serves to compensate for response characteristics at high frequencies. The high-frequency-compensation parasitic capacitance 62 provides a low-impedance coupling between the boosted potential and the divided potential at high frequencies, thereby achieving a configuration in which a high-frequency fluctuation in the boosted potential directly propagates to the divided potential. This attains satisfactory response characteristics at high frequencies.

Figure 7A:
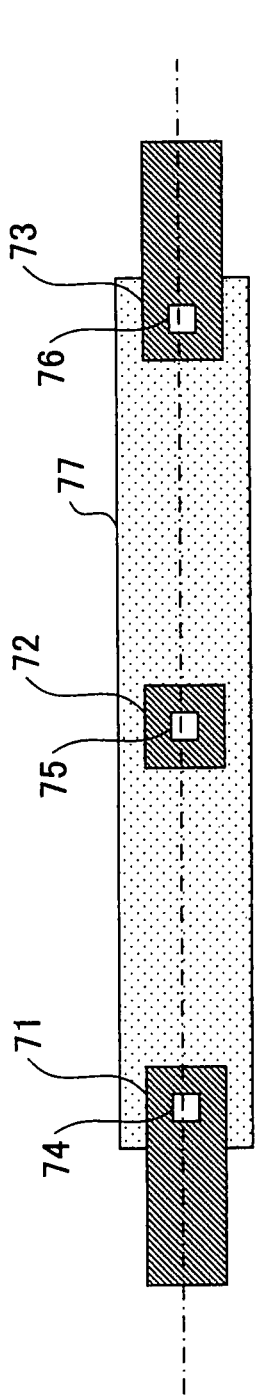
FIGS. 7A and 7B are drawings showing an example of the configuration of resistor elements and high-frequency-compensation parasitic capacitance.
Figure 7B:
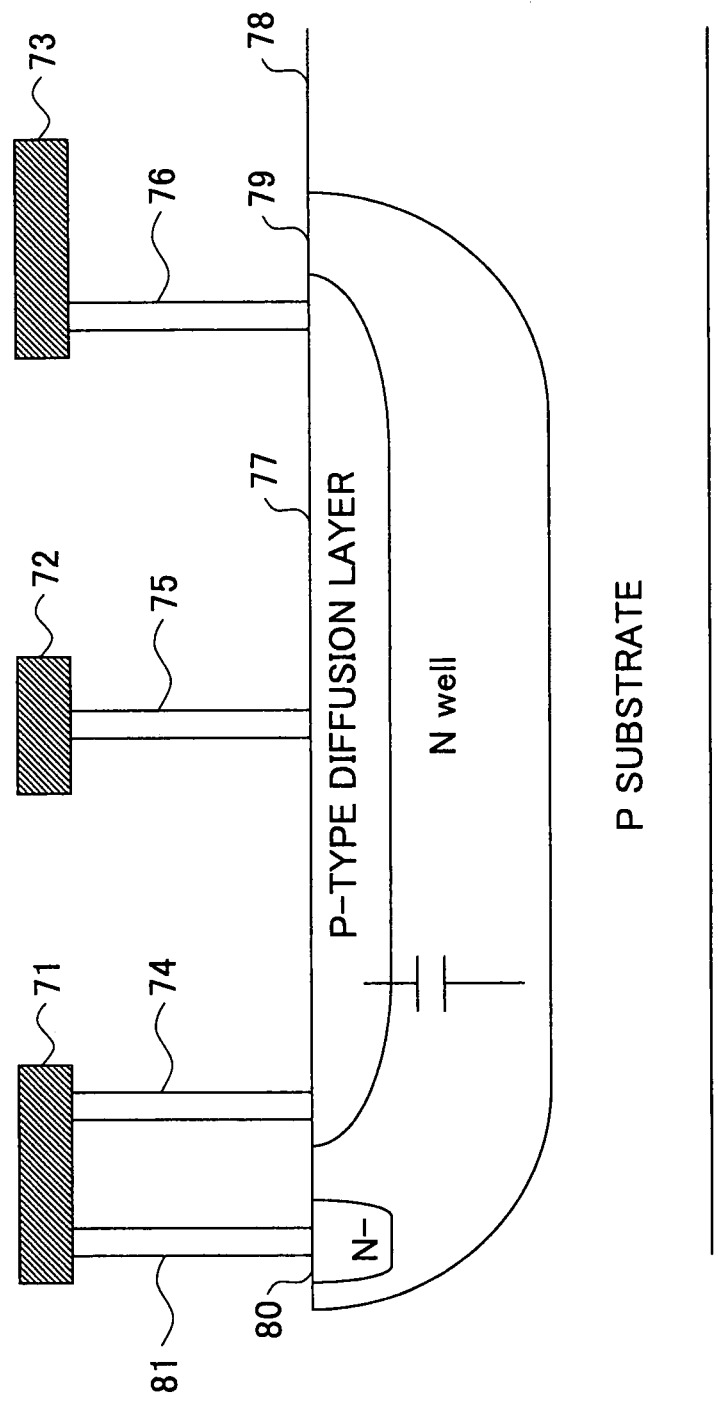

FIGS. 7A and 7B are drawings showing an example of the configuration of the resistor elements R1 and R2 and high-frequency-compensation parasitic capacitance. 62 of the voltage detecting circuit 60. FIG. 7A is a plan view of the resistor elements, and FIG. 7B is a cross-sectional view of the resistor elements.

The configuration shown in FIGS. 7A and 7B includes a metal interconnect 71, metal interconnect 72, and metal interconnect 73 disposed in a metal layer, and includes contacts 74 through 76, a P-type diffusion layer 77, a P-type substrate 78, an N well 79, an N region 80, and a contact 81. The N well 79 is formed in the P-type substrate 78, and the P-type diffusion layer 77 is formed in the N well 79. The metal interconnects 71 through 73 are connected to the P-type diffusion layer 77 via the respective contacts 74 through 76.

The N region 80 for the purpose of potential coupling is provided in the N well 79, and is connected to the metal interconnect 71 via the contact 81. With this configuration, the potential of the N well 79 is set to the potential of the metal interconnect 71.

The metal interconnect 71 is coupled to a boosted potential generated by the boosted-voltage generating circuit 23, and corresponds to the position of a node A shown in FIG. 6. The metal interconnect 72 is coupled to a divided potential appearing at the joint point between the resistor elements R1 and R2, and corresponds to the position of a node B shown in FIG. 6. The metal interconnect 73 is coupled to one end of the resistor element R2 on the ground potential side, and corresponds to the position of a node C shown in FIG. 6. A single P-type diffusion layer 77 constitutes the resistor elements R1 and R2, and the contact 75 situated halfway through the longitudinal extension of the P-type diffusion layer 77 serves to provide the divided potential. Namely, the contact 75 is connected to the P-type diffusion layer 77 at a position between the contact 74 of the metal interconnect 71 and the contact 76 of the metal interconnect 73. The ratio of potential division can be adjusted by controlling the position of the contact 75.

A parasitic capacitance exists between the P-type diffusion layer 77 and the N well 79, and serves as the high-frequency-compensation parasitic capacitance 62. The N well 79 is coupled to the boosted potential via the N region 80 as previously described, so that high-frequency-compensation parasitic capacitance 62 is coupled between the boosted potential and the P-type diffusion layer 77. Namely, the high-frequency-compensation parasitic capacitance 62 is situated between the boosted potential and the resistor elements R1 and R2 as illustrated in FIG. 6. In FIG. 6, the high-frequency-compensation parasitic capacitance 62 is illustrated as if it was comprised of two separate capacitances for the sake of illustration. In reality, however, there is only a single capacitance covering over the entirety of the resistor elements R1 and R2 (i.e., the entirety of the P-type diffusion layer 77) inclusive of the junction point for the contact 75 (i.e., the node for detecting the divided potential) as shown in FIG. 7.

In the first embodiment of the voltage detecting circuit according to the present invention, the P-type diffusion layer constitutes the resistor elements of the potential divider circuit, and the N well formed around the P-type diffusion layer is coupled to the potential that is to be detected (i.e., the boosted potential in this example). This configuration makes it possible for the parasitic capacitance between the P-type diffusion layer and the N well to serve as a high-frequency-compensation parasitic capacitance, thereby providing a voltage detecting circuit that has a high-frequency-compensation capacitance without using a capacitive element.

FIG. 8 is a drawing showing an example of the configuration of a second embodiment of a voltage detecting circuit according to the present invention. FIG. 8 shows a configuration relevant to the detection of a negative potential by the voltage detecting circuit.

The voltage detecting circuit 85 of FIG. 8 includes resistor elements R3 and R4, a differential amplifier 86, and a high-frequency-compensation parasitic capacitance 87. The differential amplifier 86 operates as a comparator circuit for comparing two inputs, and has an output thereof supplied as a drive signal (activation signal) to the negative-voltage generating circuit 24 so as to control the active/inactive state of the negative-voltage generating circuit 24. The non-inverted input node of the differential amplifier 86 receives a potential obtained by the resistor elements R3 and R4 dividing a negative potential output from the negative-voltage generating circuit 24, and the inverted input of the differential amplifier 86 receives a reference potential generated by the reference potential generating circuit 29. The operation of the voltage detecting circuit 85 shown in FIG. 8 is basically the same as that of the voltage detecting circuit 60 shown in FIG. 6.

Figure 9A:
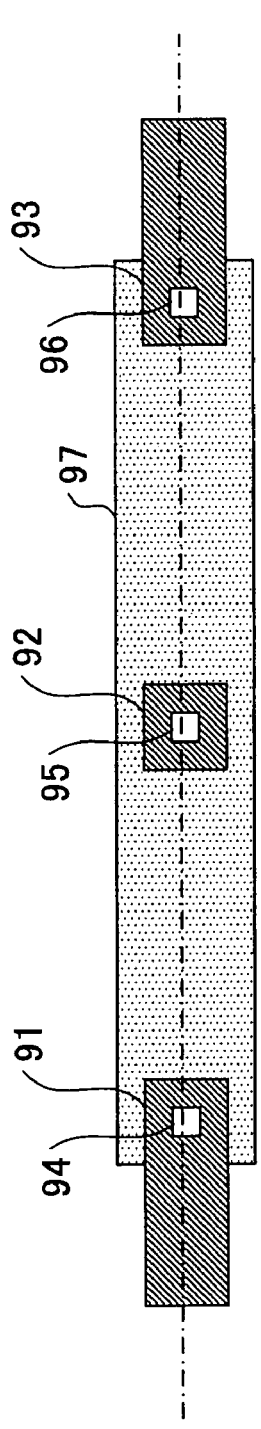
FIGS. 9A and 9B are drawings showing an example of the configuration of resistor elements and high-frequency-compensation parasitic capacitance.
Figure 9B:
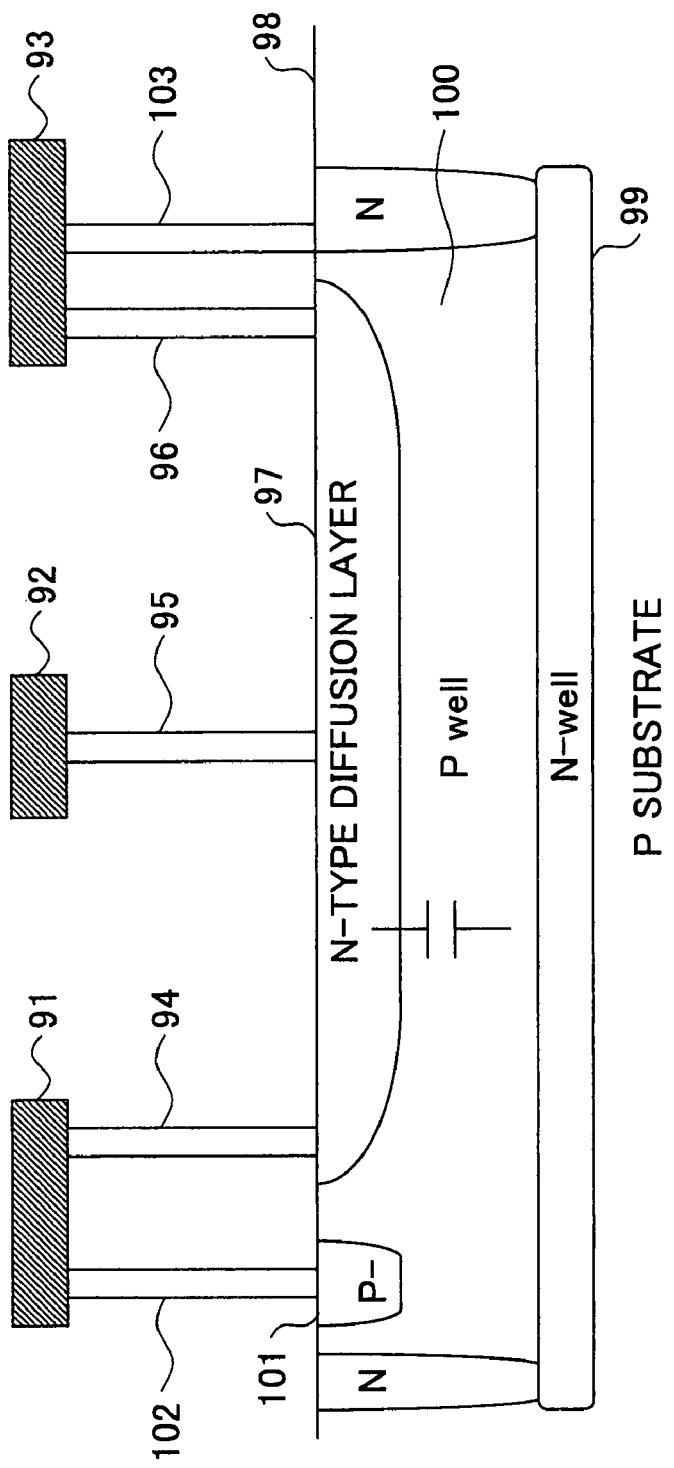

FIGS. 9A and 9B are drawings showing an example of the configuration of the resistor elements R3 and R3 and high-frequency-compensation parasitic capacitance 87 of the voltage detecting circuit 85. FIG. 8A is a plan view of the resistor elements, and FIG. 8B is a cross-sectional view of the resistor elements.

The configuration shown in FIGS. 9A and 9B includes a metal interconnect 91, metal interconnect 92, and metal interconnect 93 disposed in a metal layer, and includes contacts 94 through 96, an N-type diffusion layer 97, a P-type substrate 98, an N well 99, a P well 100, a P region 101, a contact 102, and a contact 103. The N well 99 is formed in the P-type substrate 98, with the P well 100 formed in the N well 99, and the N-type diffusion layer 97 formed in the P well 100. The metal interconnects 91 through 93 are connected to the N-type diffusion layer 97 via the respective contacts 94 through 96.

The P region 101 for the purpose of potential coupling is provided in the P well 100, and is connected to the metal interconnect 91 via the contact 102. With this configuration, the potential of the P well 100 is set to the potential of the metal interconnect 91.

The metal interconnect 91 is coupled to a negative potential generated by the negative-voltage generating circuit 24, and corresponds to the position of a node D shown in FIG. 8. The metal interconnect 92 is coupled to a divided potential appearing at the joint point between the resistor elements R3 and R4, and corresponds to the position of a node E shown in FIG. 8. The metal interconnect 93 is coupled to one end of the resistor element R3 on the power supply potential side, and corresponds to the position of a node F shown in FIG. 8. A single N-type diffusion layer 97 constitutes the resistor elements R3 and R4, and the contact 95 situated halfway through the longitudinal extension of the N-type diffusion layer 97 serves to provide the divided potential. The ratio of potential division can be adjusted by controlling the position of the contact 95.

A parasitic capacitance exists between the N-type diffusion layer 97 and the P well 100, and serves as the high-frequency-compensation parasitic capacitance 87. The P well 100 is coupled to the negative potential via the P region 101 as previously described, so that high-frequency-compensation parasitic capacitance 87 is coupled between the negative potential and the N-type diffusion layer 97. Namely, the high-frequency-compensation parasitic capacitance 87 is situated between the negative potential and the resistor elements R3 and R4 as illustrated in FIG. 8. In FIG. 8, the high-frequency-compensation parasitic capacitance 87 is illustrated as if it was comprised of two separate capacitances for the sake of illustration. In reality, however, there is only a single capacitance covering over the entirety of the resistor elements R3 and R4 (i.e., the entirety of the N-type diffusion layer 97) inclusive of the junction point for the contact 95 (i.e., the node for detecting the divided potential) as shown in FIG. 9.

In the second embodiment of the voltage detecting circuit according to the present invention, the N-type diffusion layer constitutes the resistor elements of the potential divider circuit, and the P well formed around the N-type diffusion layer is coupled to the potential that is to be detected (i.e., the negative potential in this example). This configuration makes it possible for the parasitic capacitance between the N-type diffusion layer and the P well to serve as a high-frequency-compensation parasitic capacitance, thereby providing a voltage detecting circuit that has a high-frequency-compensation capacitance without using a capacitive element.

In the first or second embodiment described above, the parasitic capacitance in existence between the P-type diffusion layer 77 and the N well 79 or between the N-type diffusion layer 97 and the P well 100 serves as a high-frequency-compensation parasitic capacitance. If the capacitance value of such parasitic capacitance is too large, low impedance appears even with respect to low-frequency changes in the detected potential. In such a case, the divided potential changes to follow a low-frequency change in the detected potential, so that the divided potential may be set to a different potential than a true divided potential that should be produced by the resistor-based potential division.

Figure 10:
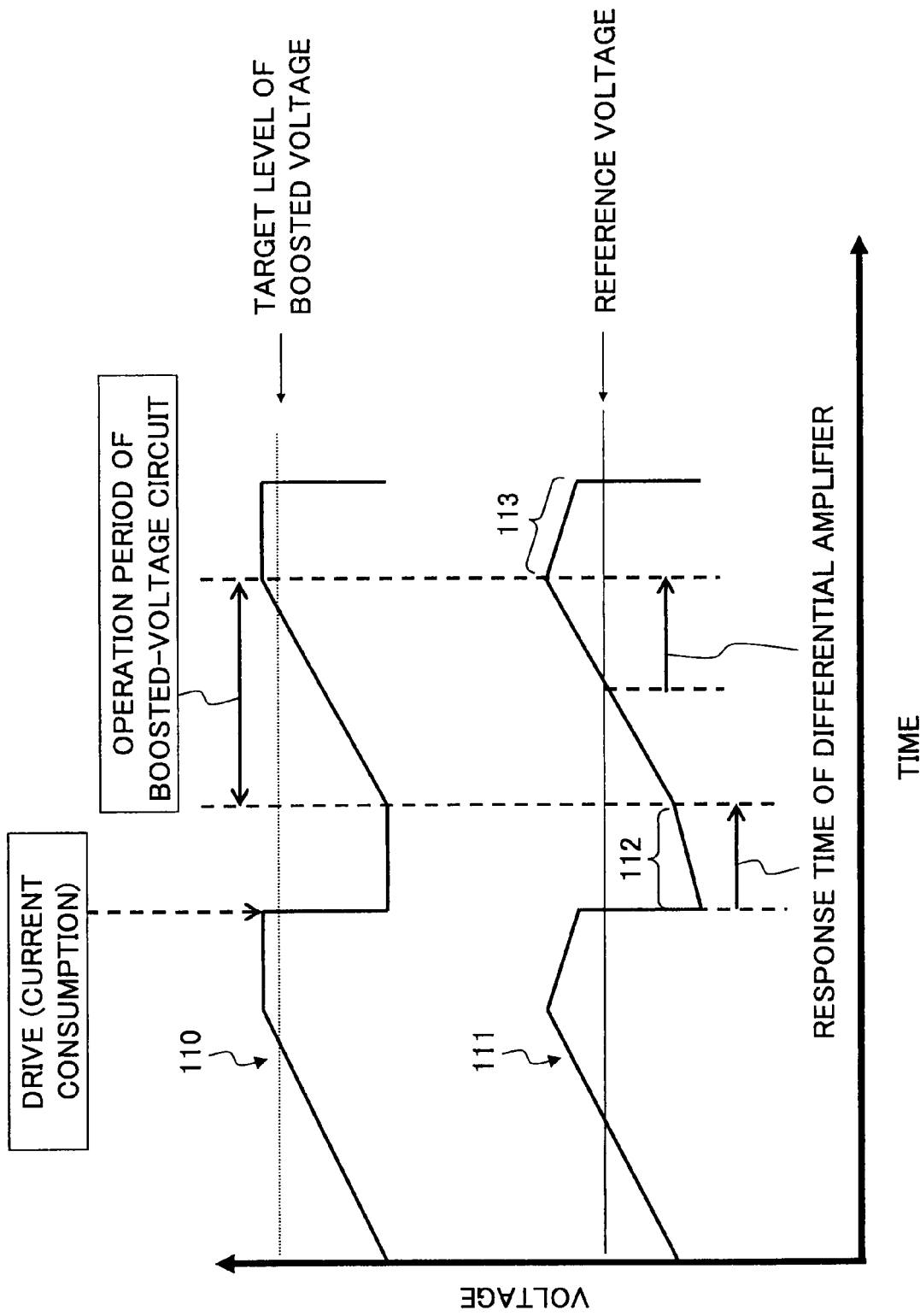
FIG. 10 is a voltage waveform diagram for explaining a voltage fluctuation in the case of the first embodiment.

FIG. 10 is a voltage waveform diagram for explaining a voltage fluctuation in the case of the first embodiment. In FIG. 10, a voltage waveform 110 illustrates a fluctuation in the boosted potential, and a voltage waveform 111 illustrates a fluctuation in the divided potential.

As the boosted potential drops due to current consumption by the driving of a load circuit as shown by the voltage waveform 110, the divided potential also drops as shown by the voltage waveform 111 due to capacitive coupling through the high-frequency-compensation parasitic capacitance 62. Thereafter, the amount of electric charge in the high-frequency-compensation parasitic capacitance 62 gradually changes, so that the divided potential changes until it reaches the potential defined by the ratio of the resistor elements R1 and R2. Such a change is illustrated as a waveform portion 112. Upon the start of operation of the boosted-voltage generating circuit 23 after a predetermined response time of the differential amplifier circuit, the boosted potential rises as shown by the voltage waveform 110, so that the divided potential having a capacitive coupling to the boosted potential rises substantially in the same manner as the boosted potential. As the divided potential exceeds the reference potential, the operation of the boosted-voltage generating circuit 23 comes to a halt after a predetermined response time of the differential amplifier circuit. Thereafter, the amount of electric charge in the high-frequency-compensation parasitic capacitance 62 gradually changes, so that the divided potential changes until it reaches the potential defined by the ratio of the resistor elements R1 and R2. Such a change is illustrated as a waveform portion 113.

In this manner, the capacitive coupling through the high-frequency-compensation parasitic capacitance 62 causes the divided potential to change in such a manner as to follow a change in the boosted potential, thereby improving the response characteristics of the voltage detecting circuit in terms of boosted-potential fluctuation. If the capacitance value of the high-frequency-compensation parasitic capacitance 62 is too large, however, the divided potential ends up following low-frequency fluctuation of the boosted potential. Specifically, the speed at which the divided potential changes due to a change in the amount of electric charge stored in the high-frequency-compensation parasitic capacitance 62 becomes slower (i.e., the slope of the waveform portions 112 and 113 becomes gentler), so that a next-phase change in the boosted potential may occur before the divided potential reaches the target potential defined by the ratio of the resistor elements R1 and R2. In this case, the next change in the boosted potential starts before the divided potential reaches the target potential, resulting in the accumulation of errors between the divided potential and the target potential.

Accordingly, it is desirable to provide a configuration in which the capacitance value of the high-frequency-compensation parasitic capacitance can be lowered in the configuration of the first and second embodiments. In the following, such configuration will be described.

Figure 11:
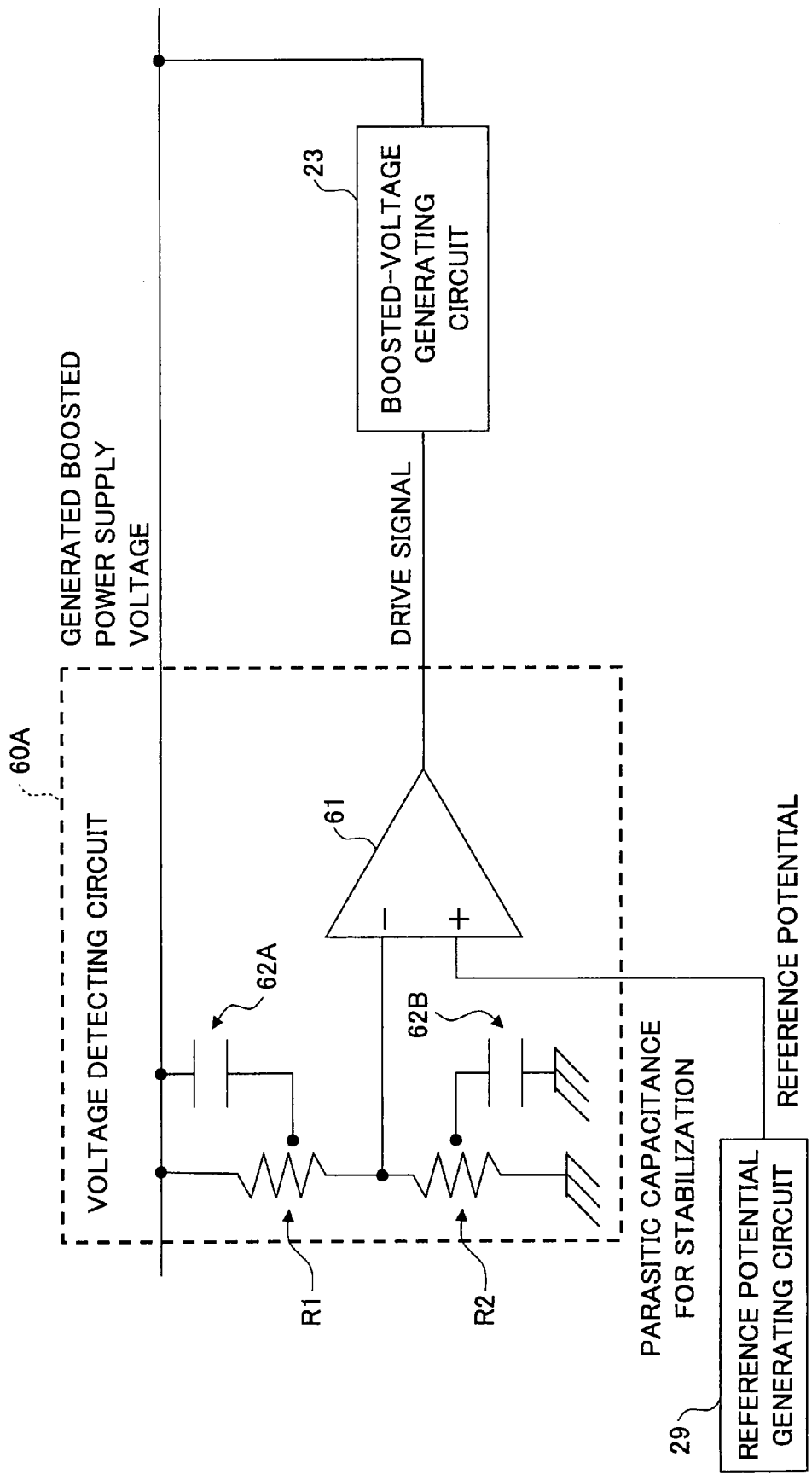
FIG. 11 is a drawing showing an example of the configuration of a third embodiment of a voltage detecting circuit according to the present invention.

FIG. 11 is a drawing showing an example of the configuration of a third embodiment of a voltage detecting circuit according to the present invention. In FIG. 11, the same elements as those of FIG. 6 are referred to by the same numerals, and a description thereof will be omitted.

The voltage detecting circuit 60A of FIG. 11 includes resistor elements R1 and R2, a differential amplifier 61, a high-frequency-compensation parasitic capacitance 62A, and a parasitic capacitance 62B. The high-frequency-compensation parasitic capacitance 62A is parasitic to the resistor element R1 formed of a diffusion layer as will later be described, and serves to compensate for response characteristics at high frequencies. The parasitic capacitance 62B is parasitic to the resistor element R2 formed of a diffusion layer.

Figures 12A, 12B:
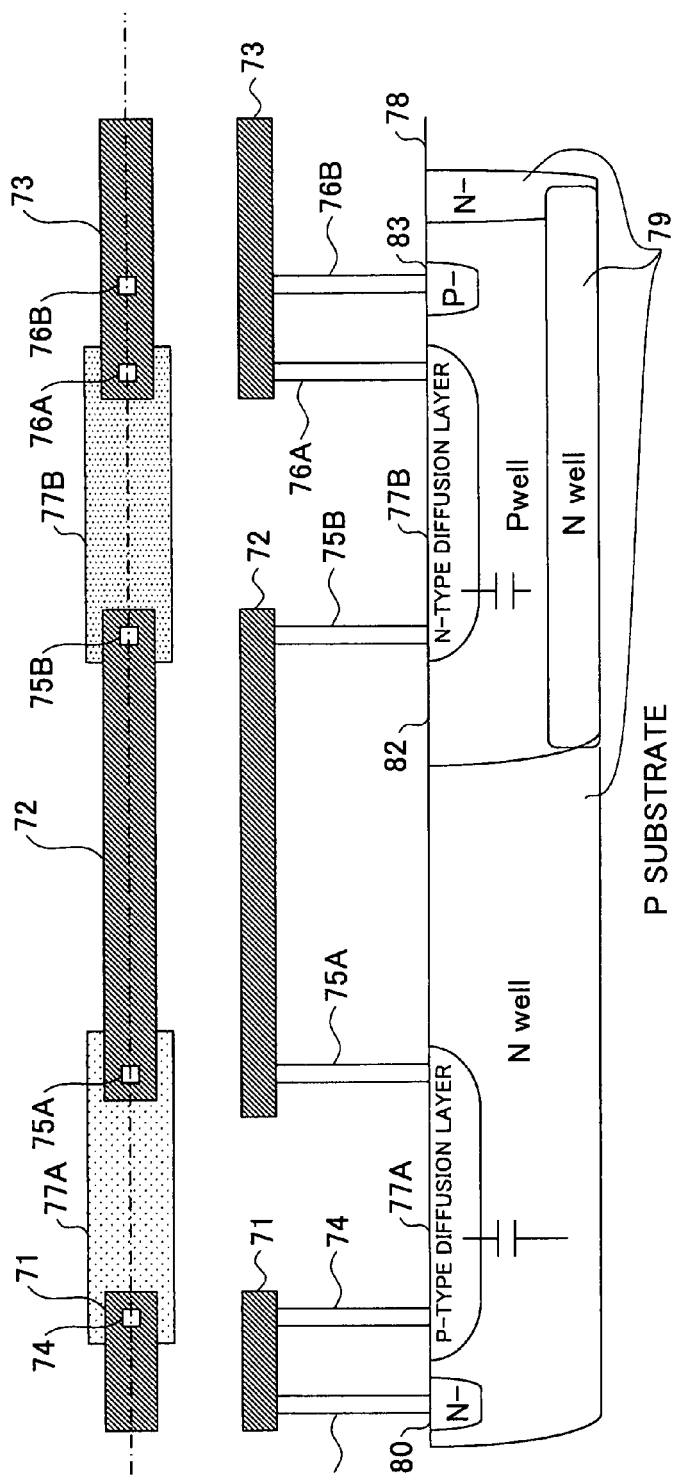
FIGS. 12A and 12B are drawings showing an example of the configuration of resistor elements and parasitic capacitance.

FIGS. 12A and 12B are drawings showing an example of the configuration of the resistor elements R1 and R2 and parasitic capacitances 62A and 62B of the voltage detecting circuit 60A. FIG. 12A is a plan view of the resistor elements, and FIG. 12B is a cross-sectional view of the resistor elements. In FIGS. 12A and 12B, the same elements as those of FIGS. 7A and 7B are referred to by the same numerals, and a description thereof will be omitted.

The configuration shown in FIGS. 12A and 12B includes a metal interconnect 71, metal interconnect 72, and metal interconnect 73 disposed in a metal layer, and includes contacts 74A and 75B, contact 76A and 76B, a P-type diffusion layer 77A, an N-type diffusion layer 77B, a P-type substrate 78, an N well 79, an N region 80, a contact 81, a P well 82, and a P region 83. The N well 79 is formed in the P-type substrate 78, and the P-type diffusion layer 77A and the P-well 82 are formed in the N well 79. Further, the N-type diffusion layer 77B is formed in the P-well 82. The metal interconnect 71 is connected to the P-type diffusion layer 77A via the contact 74. The metal interconnect 72 is connected to the P-type diffusion layer 77A via the contact 75A, and is also connected to the N-type diffusion layer 77B via the contact 75B. The metal interconnect 73 is connected to the N-type diffusion layer 77B via the contact 76A, and is also connected to the P region 83 of the P-well 82 via the contact 76B.

The N region 80 for the purpose of potential coupling is provided in the N well 79, and is connected to the metal interconnect 71 via the contact 81. With this configuration, the potential of the N well 79 is set to the potential of the metal interconnect 71. Further, the metal interconnect 73 is connected to the P region 83 of the P-well 82 via the contact 76B as described above, so that the potential of the P-well 82 is set to the potential of the metal interconnect 73.

A parasitic capacitance exists between the P-type diffusion layer 77A and the N well 79, and serves as the high-frequency-compensation parasitic capacitance 62A. The N well 79 is coupled to the boosted potential via the N region 80 as previously described, so that high-frequency-compensation parasitic capacitance 62A is coupled between the boosted potential and the P-type diffusion layer 77A. Namely, the high-frequency-compensation parasitic capacitance 62A is situated between the boosted potential and the resistor element R1 (and the node for detecting a divided potential) as illustrated in FIG. 11.

Further, a parasitic capacitance exists between the N-type diffusion layer 77B and the P-well 82. The P-well 82 is coupled to the ground potential via the P region 83, so that this parasitic capacitance is coupled between the ground potential and the N-type diffusion layer 77B. Namely, the parasitic capacitance 62B is situated between the ground potential and the resistor element R2 (and the node for detecting a divided potential) as illustrated in FIG. 11.

In the third embodiment of the voltage detecting circuit according to the present invention, the P-type diffusion layer and N-type diffusion layer constitutes the resistor elements of the potential divider circuit, and the N well formed around the P-type diffusion layer is coupled to the potential that is to be detected (i.e., the boosted potential in this example), with the P well formed around the N-type diffusion layer being coupled to a fixed potential (i.e., the ground potential in this example). This configuration makes it possible for the parasitic capacitance between the P-type diffusion layer and the N well to serve as a high-frequency-compensation parasitic capacitance, and also couples the parasitic capacitance of the resistor element (i.e., N-type diffusion layer) on the ground side to the ground potential, thereby preventing the capacitance of the high-frequency-compensation capacitance from becoming larger than necessary.

Figure 13:
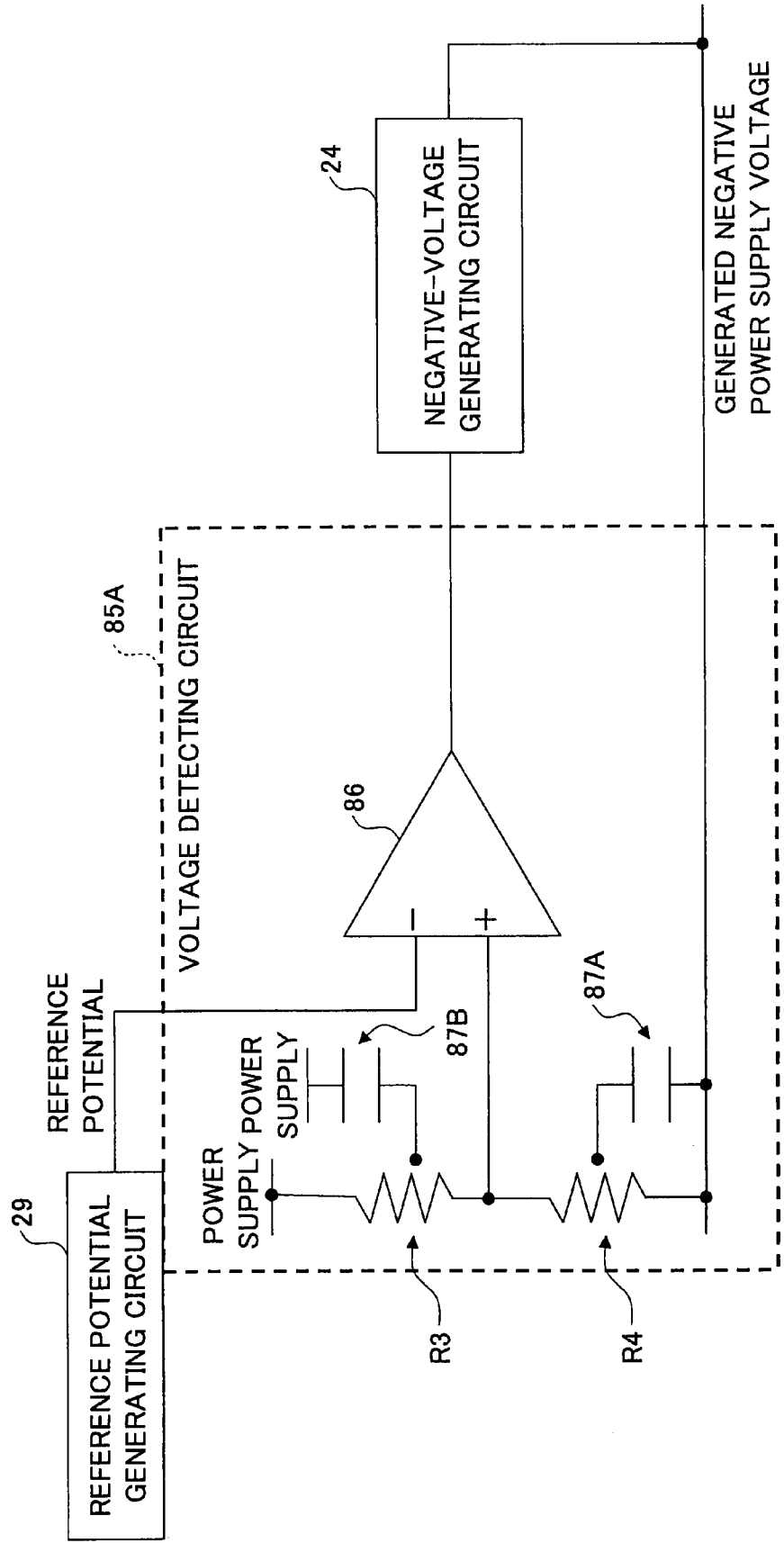
FIG. 13 is a drawing showing an example of the configuration of a fourth embodiment of a voltage detecting circuit according to the present invention.

FIG. 13 is a drawing showing an example of the configuration of a fourth embodiment of a voltage detecting circuit according to the present invention. In FIG. 13, the same elements as those of FIG. 8 are referred to by the same numerals, and a description thereof will be omitted.

The voltage detecting circuit 85A of FIG. 13 includes resistor elements R3 and R4, a differential amplifier 86, a high-frequency-compensation parasitic capacitance 87A, and a parasitic capacitance 87B. The high-frequency-compensation parasitic capacitance 87A is parasitic to the resistor element R4 formed of a diffusion layer as will later be described, and serves to compensate for response characteristics at high frequencies. The parasitic capacitance 87B is parasitic to the resistor element R3 formed of a diffusion layer.

Figure 14:
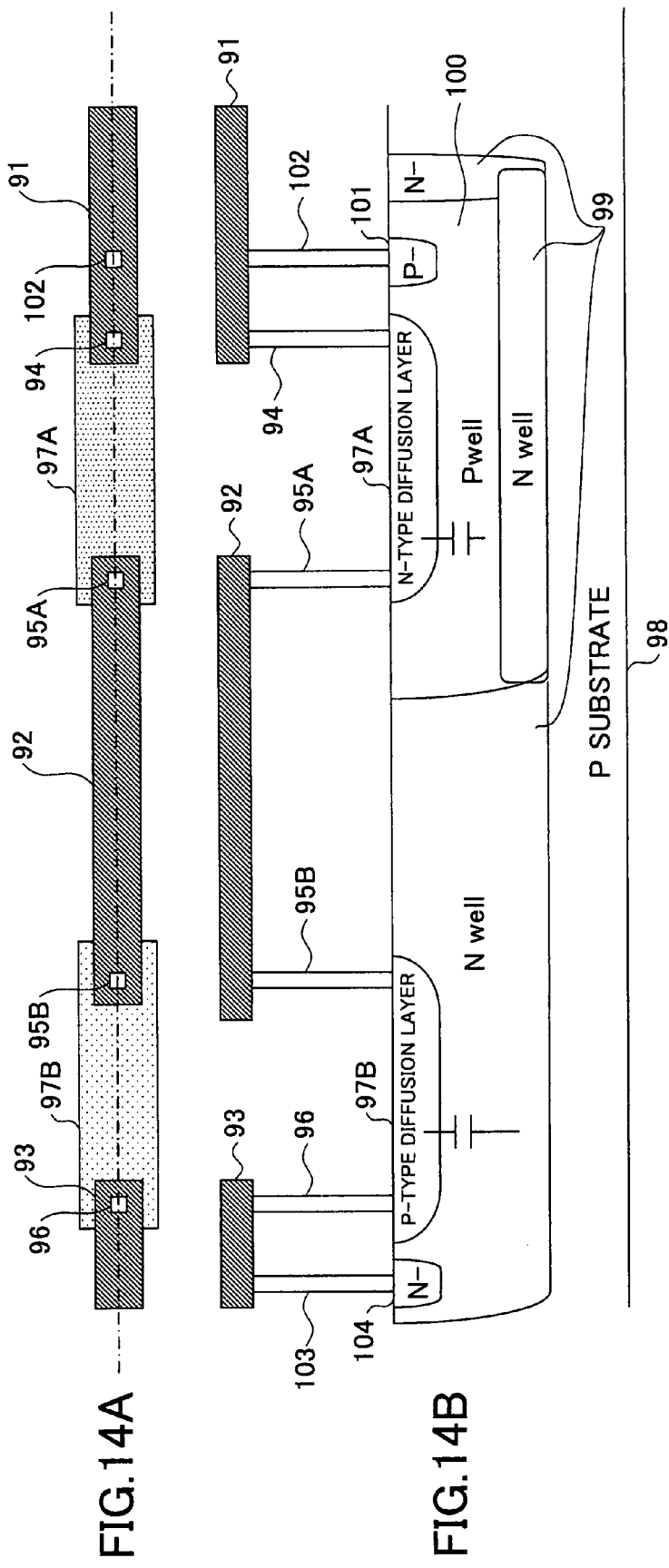
FIGS. 14A and 14B are drawings showing an example of the configuration of resistor elements and parasitic capacitance.

FIGS. 14A and 14B are drawings showing an example of the configuration of the resistor elements R3 and R4 and parasitic capacitances 87A and 87B of the voltage detecting circuit 85A. FIG. 14A is a plan view of the resistor elements, and FIG. 14B is a cross-sectional view of the resistor elements.

The configuration shown in FIGS. 14A and 14B includes a metal interconnect 91, metal interconnect 92, and metal interconnect 93 disposed in a metal layer, and includes a contact 94, 95A, 95B, and 96, an N-type diffusion layer 97A, a P-type diffusion layer 97B, a P-type substrate 98, an N well 99, a P well 100, a P region 101, a contact 102, a contact 103, and an N region 104. The N well 99 is formed in the P-type substrate 98, and the P-type diffusion layer 97B and the P well 100 are formed in the N well 99, with the N-type diffusion layer 97A formed in the P well 100.

The metal interconnect 91 is connected to the N-type diffusion layer 97A via the contact 94, and is also connected to the P region 101 of the P-well 100 via the contact 102. The metal interconnect 92 is connected to the N-type diffusion layer 97A via the contact 95A, and is also connected to the P-type diffusion layer 97B via the contact 95B. The metal interconnect 93 is connected to the P-type diffusion layer 97B via the contact 96, and is also connected to the N region 104 of the N-well 99 via the contact 103.

With these connecting, the potential of the P well 100 is set to the potential of the metal interconnect 91. Further, the potential of the N well 99 is set to the potential of the metal interconnect 93. The metal interconnect 91 is coupled to a negative potential generated by the negative-voltage generating circuit 24, and the metal interconnect 93 is coupled to one end of the resistor element R3 on the power supply potential side.

A parasitic capacitance exists between the N-type diffusion layer 97A and the P well 100, and serves as the high-frequency-compensation parasitic capacitance 87A. The P well 100 is coupled to the negative potential via the P region 101 as previously described, so that high-frequency-compensation parasitic capacitance 87A is coupled between the negative potential and the N-type diffusion layer 97A. Namely, the high-frequency-compensation parasitic capacitance 87A is situated between the negative potential and the resistor element R4 (and the node for detecting a divided potential) as illustrated in FIG. 13.

Further, a parasitic capacitance exists between the P-type diffusion layer 97B and the N-well 99. The N-well 99 is coupled to the power supply potential via the N region 104, so that this parasitic capacitance is coupled between the power supply potential and the P-type diffusion layer 97B. Namely, the high-frequency-compensation parasitic capacitance 87B is situated between the power supply potential and the resistor element R3 (and the node for detecting a divided potential) as illustrated in FIG. 13.

In the fourth embodiment of the voltage detecting circuit according to the present invention, the N-type diffusion layer and P-type diffusion layer constitutes the resistor elements of the potential divider circuit, and the P well formed around the N-type diffusion layer is coupled to the potential that is to be detected (i.e., the negative potential in this example), with the N well formed around the P-type diffusion layer being coupled to a fixed potential (i.e., the power supply potential in this example). This configuration makes it possible for the parasitic capacitance between the N-type diffusion layer and the P well to serve as a high-frequency-compensation parasitic capacitance, and also couples the parasitic capacitance of the resistor element (i.e., P-type diffusion layer) on the power supply potential side to the power supply potential, thereby preventing the capacitance of the high-frequency-compensation capacitance from becoming larger than necessary.

Figure 15:
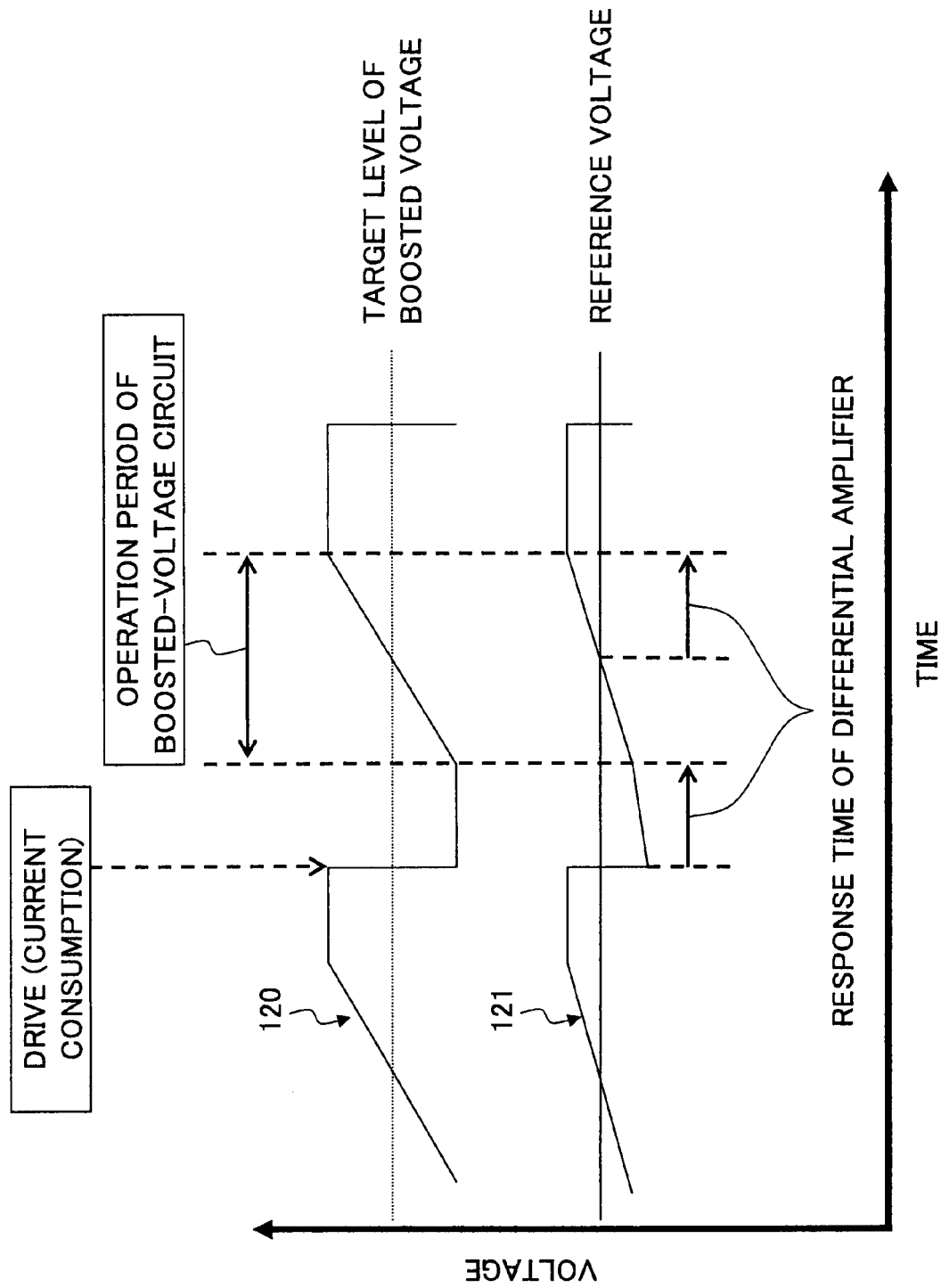
FIG. 15 is a voltage waveform diagram for explaining a voltage fluctuation in the case of the third embodiment.

FIG. 15 is a voltage waveform diagram for explaining a voltage fluctuation in the case of the third embodiment. In FIG. 15, a voltage waveform 120 illustrates a fluctuation in the boosted potential, and a voltage waveform 121 illustrates a fluctuation in the divided potential.

In the third embodiment, the capacitance value of the high-frequency-compensation parasitic capacitance is set to an appropriate value as previously described, so that the divided potential is set to a potential defined by the ratio of resistor-based potential division as far as low-frequency fluctuation is concerned, which is comparable to the operation cycles of the boosted-voltage generating circuit and the voltage detecting circuit. Namely, although the divided potential changes due to capacitive coupling between the boosted potential node and the divided potential node, capacitive impedance relevant to the low-frequency fluctuation comparable to the circuit operation cycles becomes larger than the resistance of the resistor elements constituting the potential divider circuit. This means that the divided potential is properly set to a potential defined by the ratio of resistor-based potential division.

Figure 16:
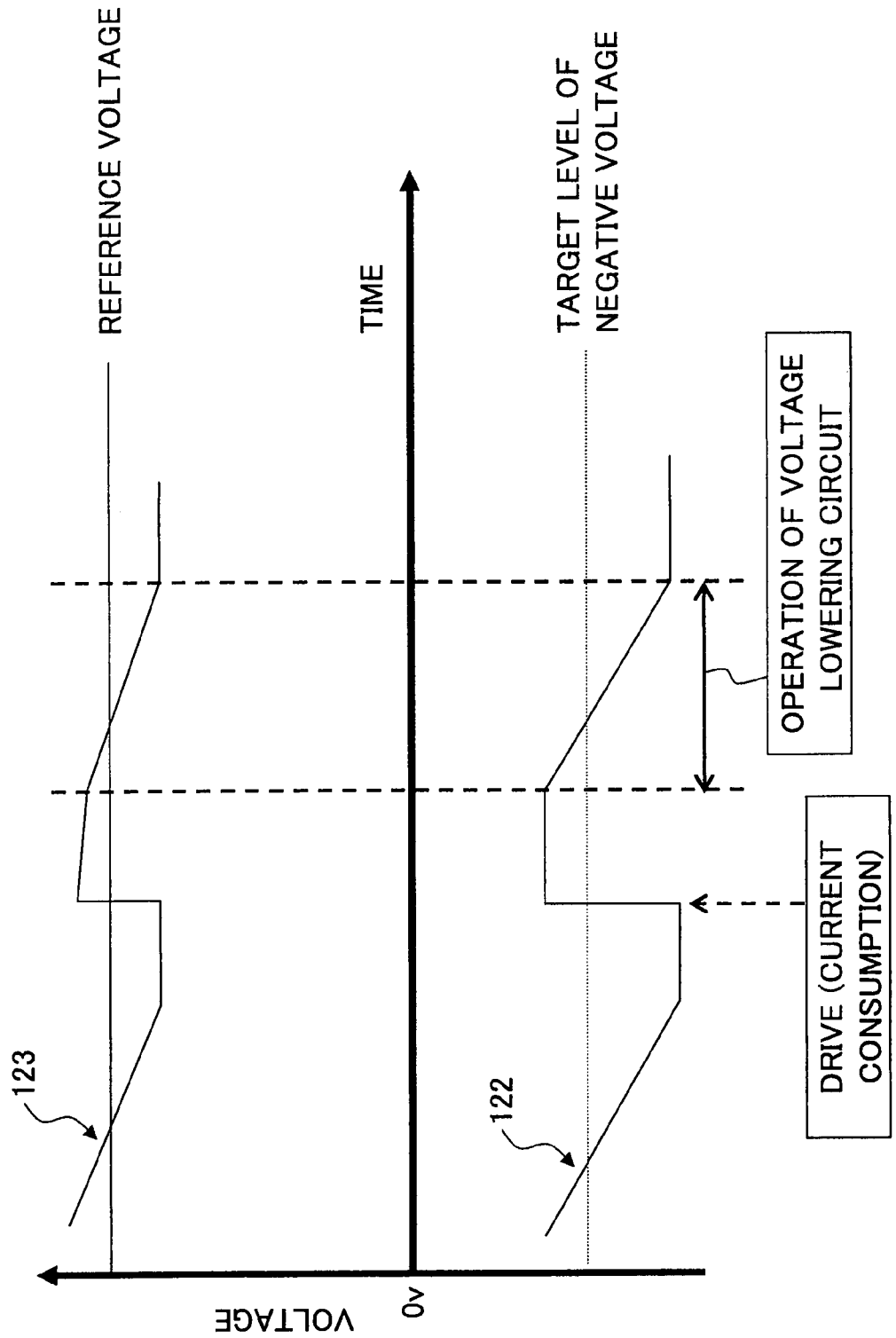
FIG. 16 is a voltage waveform diagram for explaining a voltage fluctuation in the case of the fourth embodiment.

FIG. 16 is a voltage waveform diagram for explaining a voltage fluctuation in the case of the fourth embodiment. In FIG. 16, a voltage waveform 122 illustrates a fluctuation in the negative potential, and a voltage waveform 123 illustrates a fluctuation in the divided potential. In this case, the polarity of waveforms is reversed due to the replacement of a boosted potential with a negative potential. Except for the reversal, the voltage fluctuation waveforms are substantially the same as those shown in FIG. 15. Namely, as in the third embodiment, the high-frequency-compensation parasitic capacitance is set to an appropriate value in the fourth embodiment, so that the divided potential is properly set to a potential defined by the ratio of resistor-based potential division.

In the configurations of the first through fourth embodiments described above, the capacitance value of the high-frequency-compensation parasitic capacitance is fixedly set at the time of circuit design. In order to properly set the capacitance value of high-frequency-compensation parasitic capacitance, it is desirable that the capacitance value is adjustable according to need. In the following, such configuration will be described.

Figure 17:
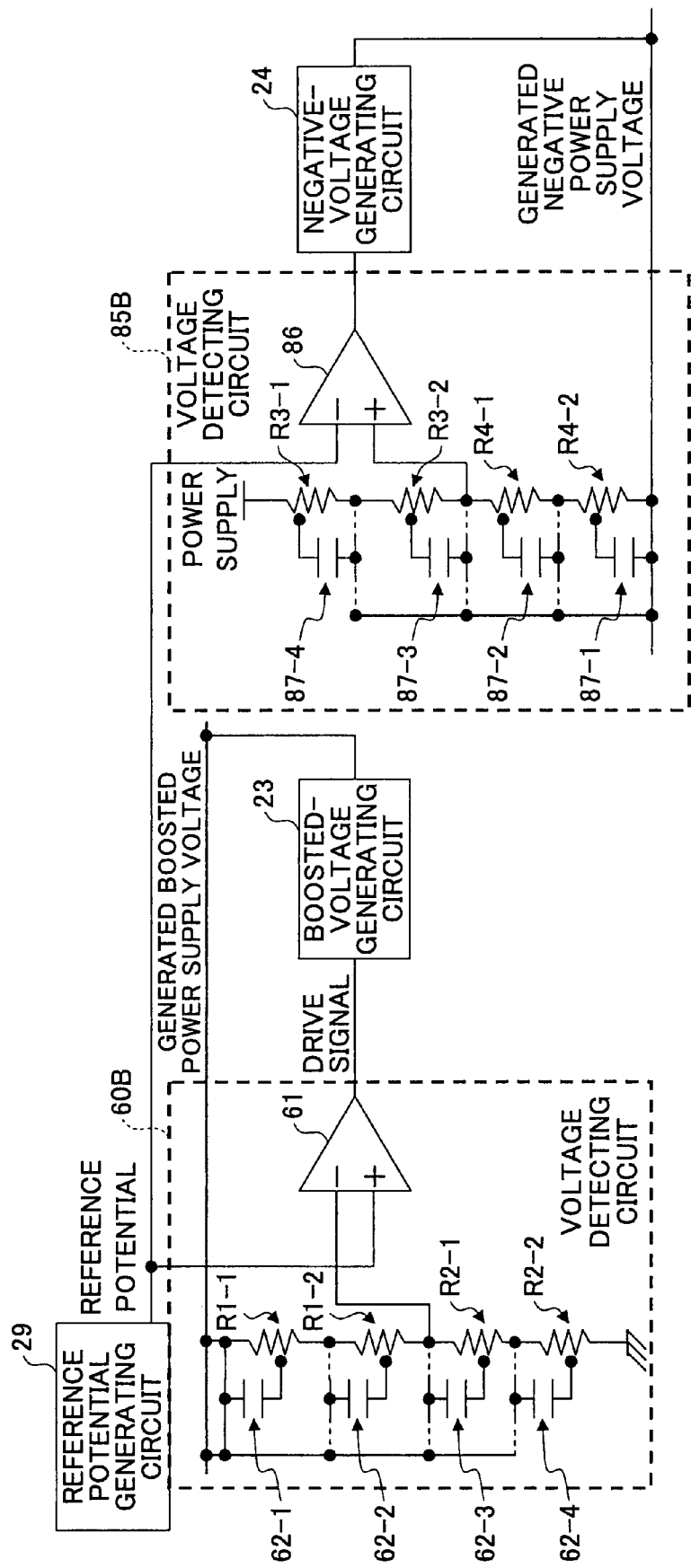
FIG. 17 is a drawing showing an example of the configuration of a fifth embodiment of a voltage detecting circuit according to the present invention.

FIG. 17 is a drawing showing an example of the configuration of a fifth embodiment of a voltage detecting circuit according to the present invention. In FIG. 17, the same elements as those of FIG. 6 and FIG. 8 are referred to by the same numerals, and a description thereof will be omitted.

A voltage detecting circuit 60B of FIG. 17 includes resistor elements R1-1, R1-2, R2-1, and R2-2, a differential amplifier 61, and parasitic capacitances 62-1 through 62-4. The parasitic capacitances 62-1 through 62-4 are parasitic to the resistor elements R1-1, R1-2, R2-1, and R2-2, respectively, which are formed of diffusion layers as will later be described. A voltage detecting circuit 85B of FIG. 17 includes resistor elements R3-1, R3-2, R4-1, and R4-2, a differential amplifier 86, and parasitic capacitances 87-1 through 87-4. The parasitic capacitances 87-1 through 87-4 are parasitic to the resistor elements R4-2, R4-1, R3-2, and R3-1, respectively, which are formed of diffusion layers as will later be described.

In FIG. 17, connections illustrated by dotted lines indicate circuit portions for which connection or disconnection is selectable. Provision is thus made such that the size of capacitance serving as high-frequency-compensation parasitic capacitance is adjustable by selecting whether to connect individual parasitic capacitances to the boosted power supply side or to the resistor-series side. A choice between connection and disconnection may be made by mask switching, or may be made by selectively cutting one of the connections through laser exposure. In so doing, the portion disconnected by the laser beam may be implemented as a fuse.

Figure 18:
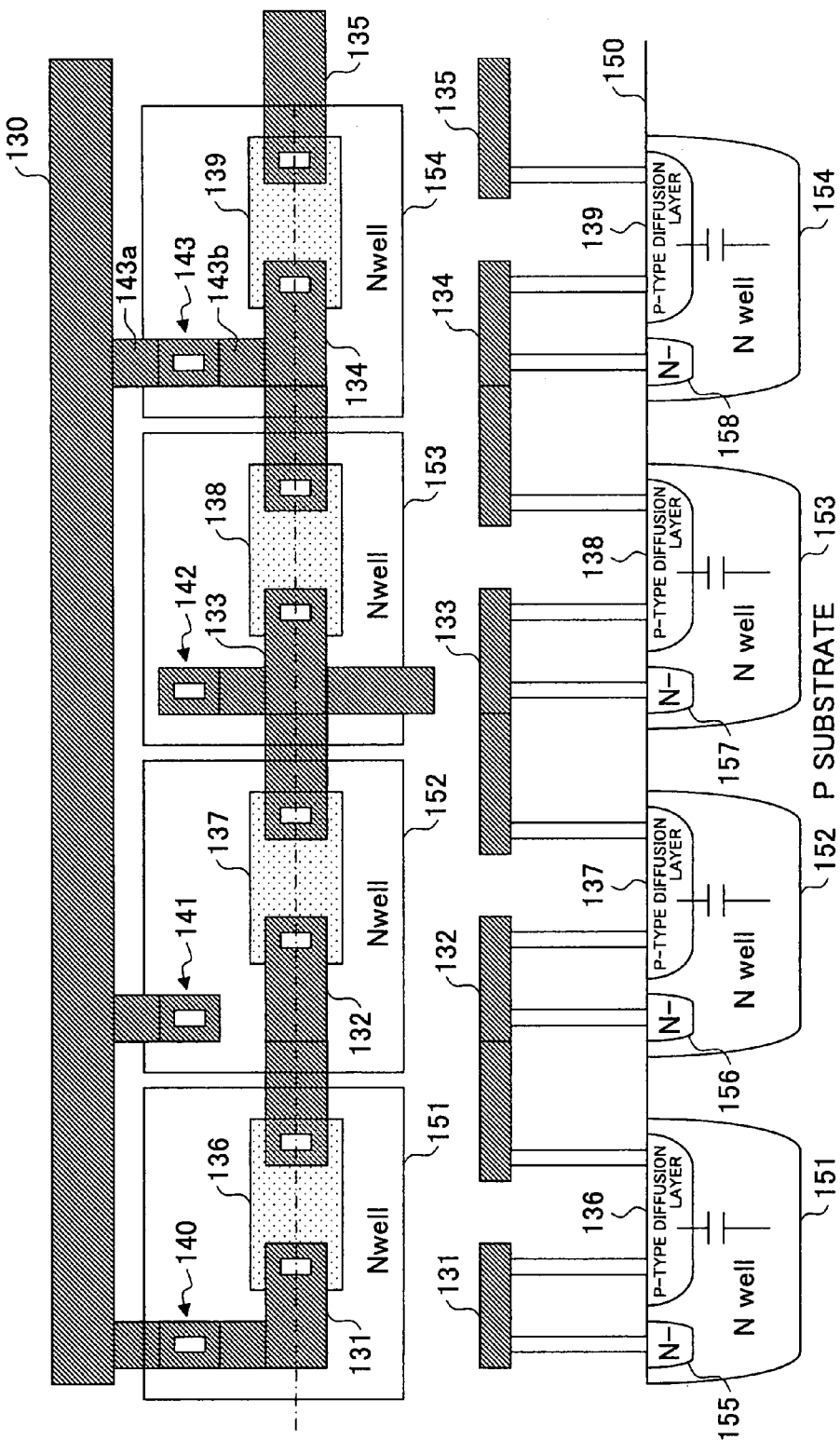
FIGS. 18A and 18B are drawings showing an example of the configuration of resistor elements and parasitic capacitance.

FIGS. 18A and 18B are drawings showing an example of the configuration of the resistor elements and parasitic capacitances of the voltage detecting circuit 60B. FIG. 18A is a plan view of the resistor elements, and FIG. 18B is a cross-sectional view of the resistor elements.

The configuration shown in FIGS. 18A and 18B includes metal interconnects 130 through 135 disposed in a metal layer, P-type diffusion layers 136 through 139, a metal interconnect 140, connection/disconnection-selectable interconnects 141 through 143, a P-type substrate 150, N wells 151 through 154, and N regions 155 through 158. The N wells 151 through 154 are formed in the P-type substrate 150, and the P-type diffusion layers 136 through 139 are formed in the N wells 151 through 154, respectively. The metal interconnects 131 through 135 are connected to the P-type diffusion layers 136 through 139 via contacts. Through such connections, the P-type diffusion layers 136 through 139 are connected in series via the intervening metal interconnects 132 through 134.

The metal interconnects 140 through 143 are respectively connected to the N regions 155 through 158 of the N wells 151 through 154 via contacts. The connection/disconnection-selectable interconnects 141 through 143 are electrically connected through selective cutting to either the metal interconnect 130 or the metal interconnects 132 through 134. For the sake of convenience of explanation, the connection/disconnection-selectable interconnect 143 is illustrated as being connected to both the metal interconnect 130 and the metal interconnect 134. Either a fuse portion 143a or fuse portion 143b of the connection/disconnection-selectable interconnect 143 is cut by a laser beam, for example, thereby performing selective coupling.

The metal interconnect 130 is coupled to a boosted potential generated by the boosted-voltage generating circuit 23. The P-type diffusion layers 136 through 139 correspond to the resistor elements R1-1, R1-2, R2-1, and R2-2, respectively, shown in FIG. 17.

Parasitic capacitances exist between the P-type diffusion layers 136 through 139 and the N wells 151 through 154, and are shown as parasitic capacitances 62-1 through 62-4, respectively, in FIG. 17. Selection of a connection state of the connection/disconnection-selectable interconnects 141 through 143 makes it possible to selectively couple the parasitic capacitances 62-2 through 62-4 to either the boosted potential or the resister series. Those of the parasitic capacitances 62-2 through 62-4 electrically coupled to the boosted potential serve as a high-frequency-compensation parasitic capacitance together with the parasitic capacitance 62-1. Strictly speaking, those of the parasitic capacitances 62-2 through 62-4 electrically coupled to the resistor series also provide capacitive couplings. Since such couplings are connected to potentials having dropped from the boosted potential through the resistor series, however, their function as a high-frequency-compensation parasitic capacitance is relatively small.

Figure 19:
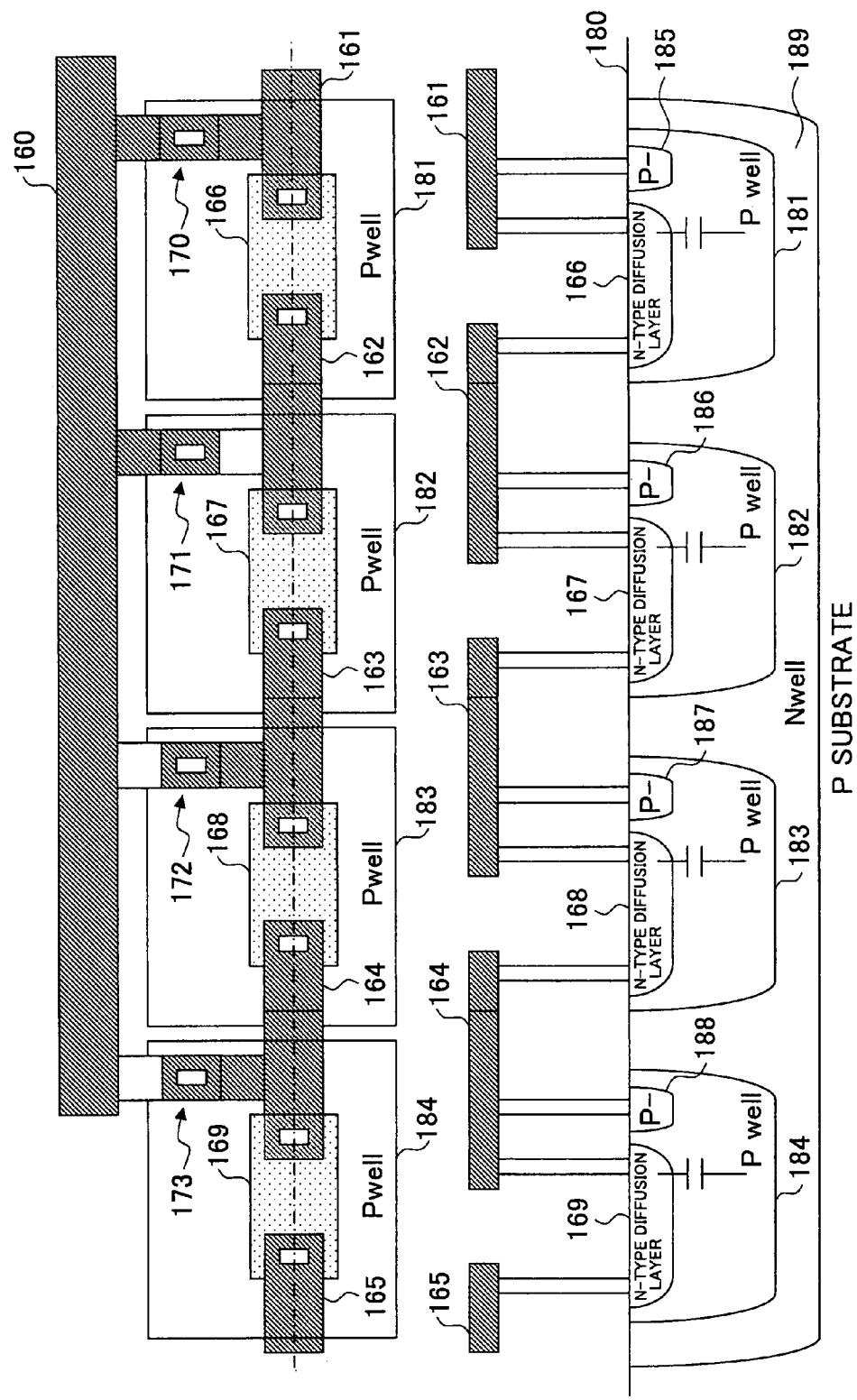
FIGS. 19A and 19B are drawings showing an example of the configuration of resistor elements and parasitic capacitance.

FIGS. 19A and 19B are drawings showing an example of the configuration of the resistor elements and parasitic capacitances of the voltage detecting circuit 85B shown in FIG. 17. FIG. 19A is a plan view of the resistor elements, and FIG. 19B is a cross-sectional view of the resistor elements.

The configuration shown in FIGS. 19A and 19B includes metal interconnects 160 through 165 disposed in a metal layer, N-type diffusion layers 166 through 169, a metal interconnect 170, connection/disconnection-selectable interconnects 171 through 173, a P-type substrate 180, P wells 181 through 184, P regions 185 through 188, and an N well 189. The P wells 181 through 184 are formed in the N well 189 of the P-type substrate 180, and the N-type diffusion layers 166 through 169 are formed in the P wells 181 through 184, respectively. The metal interconnects 161 through 165 are connected to the N-type diffusion layers 166 through 169 via contacts. Through such connections, the N-type diffusion layers 166 through 169 are connected in series via the intervening metal interconnects 162 through 164.

The metal interconnects 170 through 173 are respectively connected to the P regions 185 through 188 of the P wells 181 through 184 via contacts. The connection/disconnection-selectable interconnects 171 through 173 are electrically connected through selective cutting to either the metal interconnect 160 or the metal interconnects 162 through 164.

The metal interconnect 160 is coupled to a negative potential generated by the negative-voltage generating circuit 24. The N-type diffusion layers 166 through 169 correspond to the resistor elements R4-2, R4-1, R3-2, and R3-1, respectively, shown in FIG. 17.

Parasitic capacitances exist between the N-type diffusion layers 166 through 169 and the P wells 181 through 184, and are shown as parasitic capacitances 87-1 through 87-4, respectively, in FIG. 17. Selection of a connection state of the connection/disconnection-selectable interconnects 171 through 173 makes it possible to selectively couple the parasitic capacitances 87-2 through 87-4 to either the negative potential or the resister series. Those of the parasitic capacitances 87-2 through 87-4 electrically coupled to the negative potential serve as a high-frequency-compensation parasitic capacitance together with the parasitic capacitance 87-1. Strictly speaking, those of the parasitic capacitances 87-2 through 87-4 electrically coupled to the resistor series also provide capacitive couplings. Since such couplings are connected to potentials having dropped from the boosted potential through the resistor series, however, their function as a high-frequency-compensation parasitic capacitance is relatively small.

Figure 20:
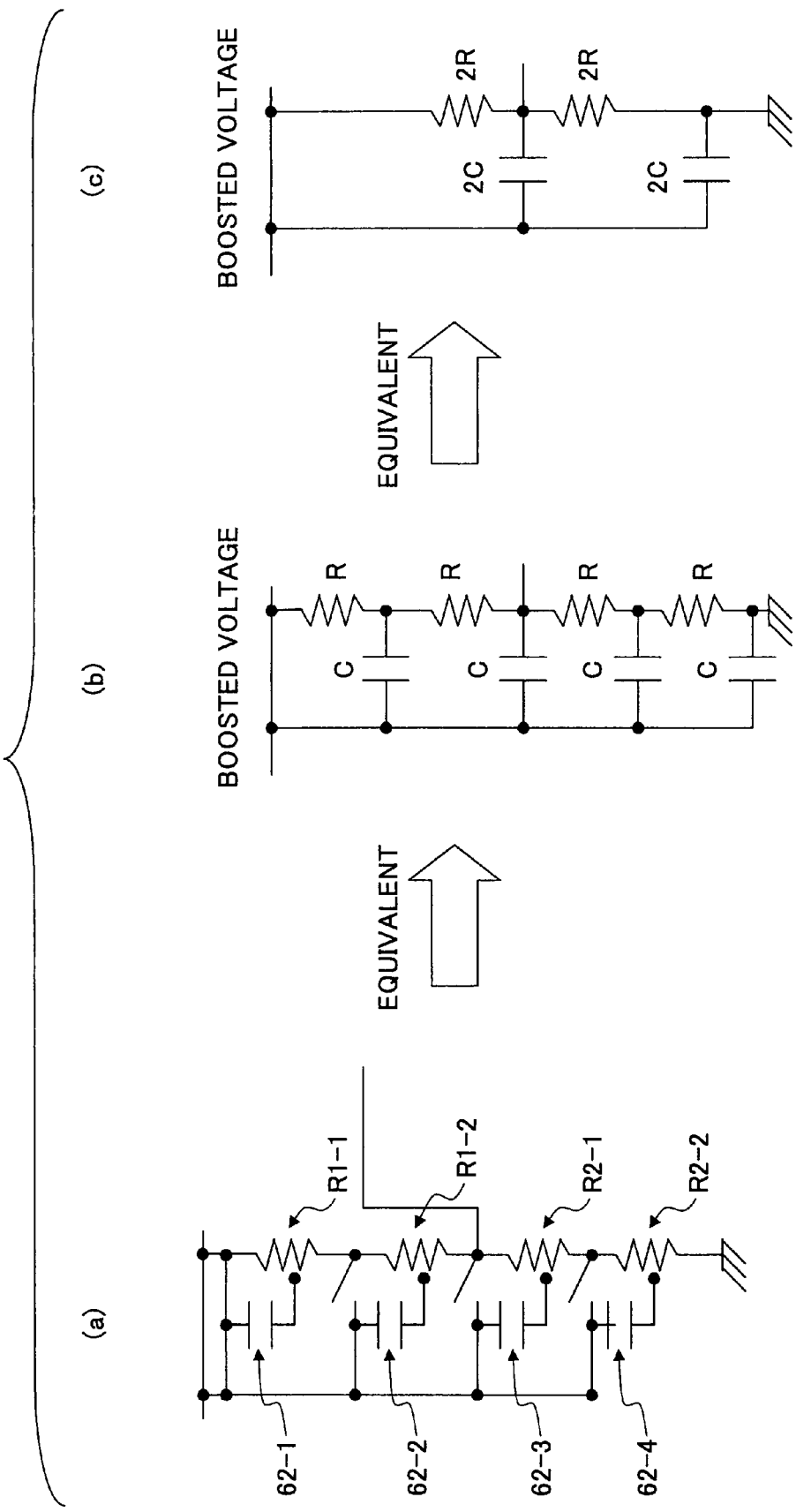
FIG. 20 is a drawing for explaining the effect of selective coupling of parasitic capacitances.
Figure 21:
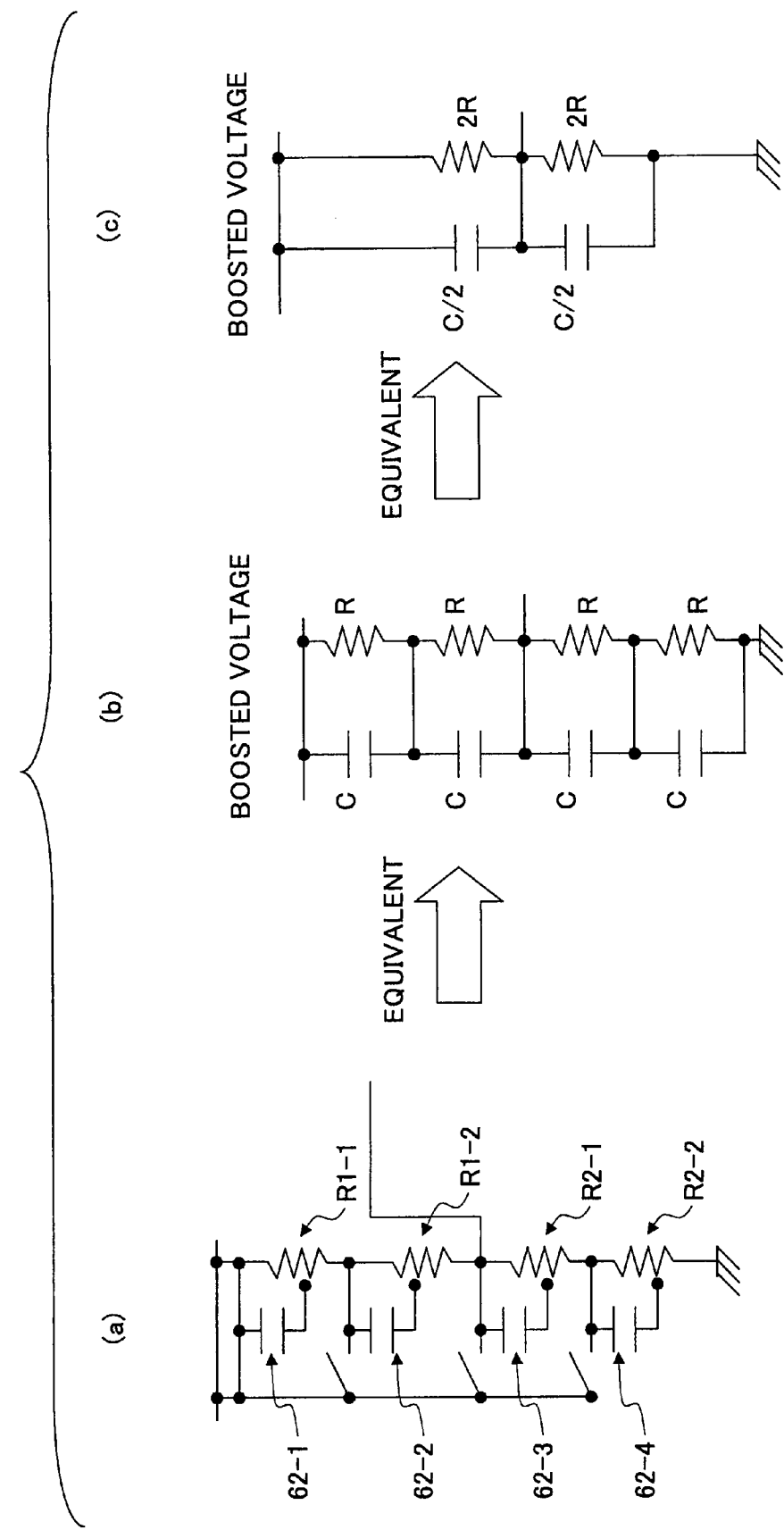
FIG. 21 is a drawing for explaining the effect of selective coupling of parasitic capacitances.

FIG. 20 and FIG. 21 are drawings for explaining the effect of selective coupling of parasitic capacitances. In FIG. 20 and FIG. 21, the same elements as those of FIG. 17 are referred to by the same numerals, and a description thereof will be omitted.

When all the parasitic capacitances 62-1 through 62-4 are electrically coupled to the boosted potential as shown in FIG. 20-($a$), such circuit corresponds to an equivalent circuit shown in FIG. 20-($b$). All the resistor elements R1-1, R1-2, R2-1, and R2-2 have the same resistance R, and all the parasitic capacitances 62-1 through 62-4 have the same capacitance value C, for example. The circuit shown in FIG. 20-($b$) is equivalent to the circuit illustrated in FIG. 20-($c$). The circuit shown in FIG. 20-($c$) is substantially the same as the circuit shown in FIG. 6, and, thus, produces the same voltage fluctuation waveforms as shown in FIG. 10.

When all the parasitic capacitances 62-2 through 62-4 are electrically coupled to the resistor series as shown in FIG. 21-($a$), such circuit corresponds to an equivalent circuit shown in FIG. 21-($b$). All the resistor elements R1-1, R1-2, R2-1, and R2-2 have the same resistance R, and all the parasitic capacitances 62-1 through 62-4 have the same capacitance value C, for example. The circuit shown in FIG. 21-($b$) is equivalent to the circuit illustrated in FIG. 21-($c$). The circuit shown in FIG. 21-($c$) is substantially the same as the circuit shown in FIG. 11, and the capacitance value is a small value, i.e., C/2. Since the capacitance is small in this case, voltage waveforms as shown in FIG. 22 may be obtained.

Figure 22:
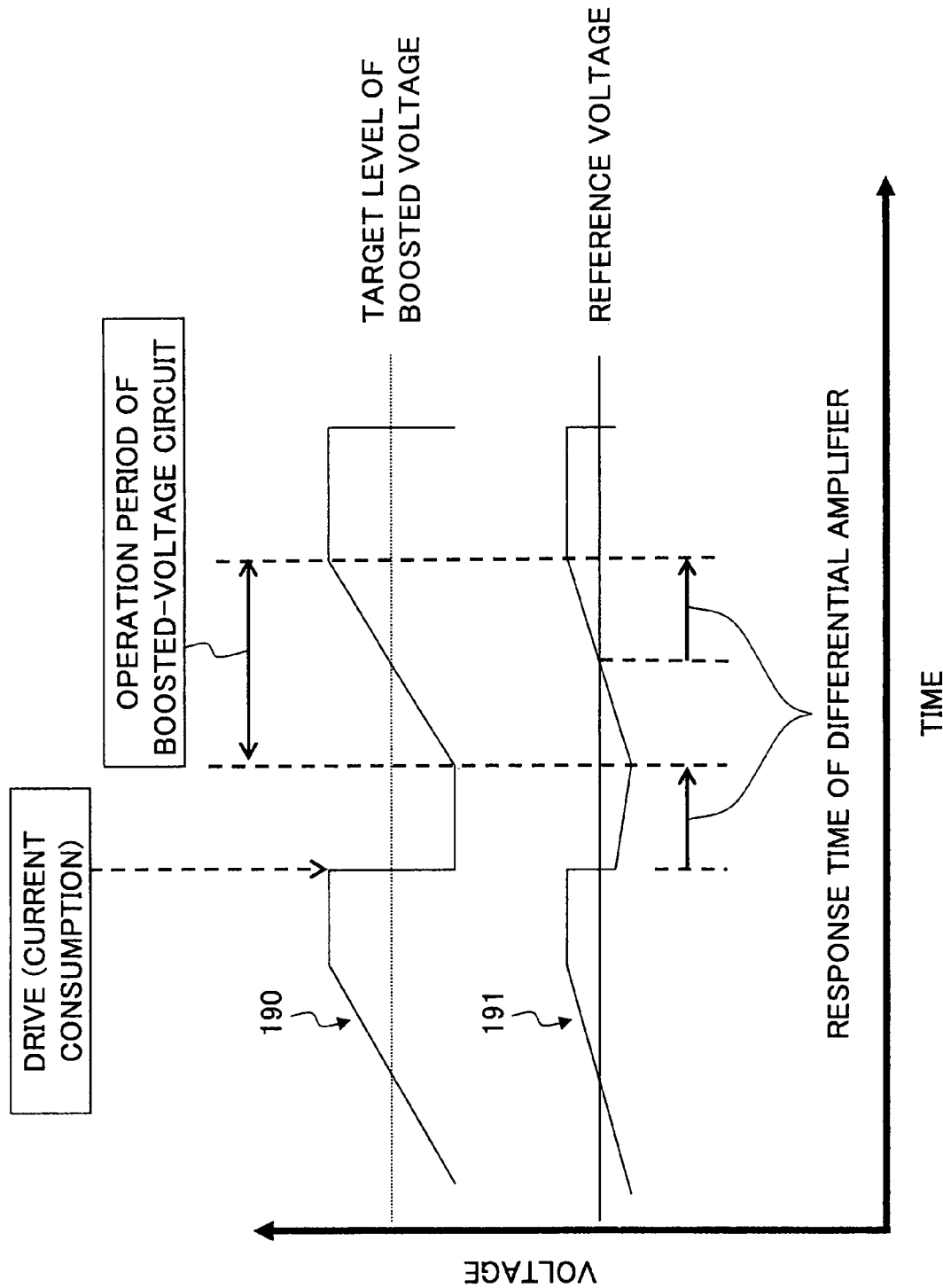
FIG. 22 is a voltage waveform diagram for explaining a voltage fluctuation in the case of FIG. 21-(c).

FIG. 22 is a voltage waveform diagram for explaining a voltage fluctuation in the case of FIG. 21-($c$). In FIG. 22, a voltage waveform 190 illustrates a fluctuation in the boosted potential, and a voltage waveform 191 illustrates a fluctuation in the divided potential.

Since capacitive coupling between the boosted potential node and the divided potential node is small, the divided potential drops only slightly as shown by the voltage waveform 191 despite that fact that the boosted potential shown as the voltage waveform 190 has a sudden drop due to current consumption by a load circuit. Thereafter, the divided voltage gradually drops due to an electric current flowing through the diffused resistors having large resistance, and is set to a potential defined by the ratio of resistor-based potential division.

Further, the present invention is not limited to these embodiments, but various variations and modifications may be made without departing from the scope of the present invention.

What is claimed is:

1. A semiconductor integrated circuit, comprising:
a semiconductor substrate;
two or more wells formed in the semiconductor substrate;
two or more diffusion layers formed in the two or more wells;
a plurality of interconnects formed in an interconnect layer, the two or more diffusion layers and the plurality of interconnects being connected in series to provide a coupling between a first potential and a second potential; and
a comparison circuit coupled to one of the interconnects set at a third potential between the first potential and the second potential, and configured to compare the third potential with a reference potential,
wherein a first interconnect of the plurality of interconnects that is set to the first potential is connected to at least a first well of the two or more wells and connected to a first diffusion layer of the two or more diffusion layers that is formed in the first well,
wherein the two or more wells include a second well, and a second interconnect of the plurality of interconnects that is set to the second potential is connected to the second well and to a second diffusion layer of the two or more diffusion layers that is formed in the second well, and wherein a conduction type of the first diffusion layer is different from a conduction type of the second diffusion layer.

2. The semiconductor integrated circuit as claimed in claim 1, wherein the one of the interconnects set at the third potential is an interconnect that connects between the first diffusion layer and the second diffusion layer.

3. The semiconductor integrated circuit as claimed in claim 1, wherein the second well is formed in the first well.

4. The semiconductor integrated circuit as claimed in claim 1, wherein the second well is connected through an interconnect to the second diffusion layer without being connected to the first interconnect.

5. The semiconductor integrated circuit as claimed in claim 1, wherein the second well is connected through a first fuse to the first interconnect and connected through a second fuse to the second diffusion layer.

6. The semiconductor integrated circuit as claimed in claim 1, further comprising a voltage generating circuit configured to generate the first potential in response to an output of the comparison circuit, wherein the voltage generating circuit is a boosted-voltage generating circuit for generating the first potential as a boosted potential or a negative-voltage generating circuit for generating the first potential as a negative potential.

7. The semiconductor integrated circuit as claimed in claim 1, wherein the first potential is subjected to detection, and is higher than the second potential, and wherein the two or more diffusion layers are P-type diffusion layers, and the first well is an N-type well.

8. The semiconductor integrated circuit as claimed in claim 1, wherein the first potential is subjected to detection, and is lower than the second potential, and wherein the two or more diffusion layers are N-type diffusion layers, and the first well is an P-type well.

* * * * *